United States Patent
Rostalski et al.

(10) Patent No.: US 7,551,361 B2
(45) Date of Patent: Jun. 23, 2009

(54) LITHOGRAPHY LENS SYSTEM AND PROJECTION EXPOSURE SYSTEM PROVIDED WITH AT LEAST ONE LITHOGRAPHY LENS SYSTEM OF THIS TYPE

(75) Inventors: Hans-Juergen Rostalski, Oberkochen (DE); Alexander Epple, Aalen (DE); Aurelian Dodoc, Oberkochen (DE); Johannes Wangler, Koenigsbronn (DE); Karl-Heinz Schuster, Koenigsbronn (DE); Joerg Schultz, Aalen (DE); Franz-Josef Stickel, Oberkochen (DE); Wolfgang Singer, Aalen (DE); Joachim Wietzorrek, Berlin (DE)

(73) Assignee: Carl Zeiss SMT AG, Oberkochen (DE)

( * ) Notice: Subject to any disclaimer, the term of this patent is extended or adjusted under 35 U.S.C. 154(b) by 75 days.

(21) Appl. No.: 10/571,267

(22) PCT Filed: Jul. 14, 2004

(86) PCT No.: PCT/EP2004/007753

§ 371 (c)(1),
(2), (4) Date: Feb. 12, 2007

(87) PCT Pub. No.: WO2005/033800

PCT Pub. Date: Apr. 14, 2005

(65) Prior Publication Data

US 2007/0258134 A1     Nov. 8, 2007

(30) Foreign Application Priority Data

Sep. 9, 2003    (DE)    .................... 103 41 986

(51) Int. Cl.
G02B 3/00    (2006.01)
(52) U.S. Cl. ...................................... 359/649
(58) Field of Classification Search ......... 359/649–651, 359/708
See application file for complete search history.

(56) References Cited

U.S. PATENT DOCUMENTS 4,906,080 A    3/1990    Omata
5,969,882 A    10/1999    Takahashi (Continued)

FOREIGN PATENT DOCUMENTS

DE        196 53 983 A1    6/1998

(Continued)

*Primary Examiner*—Darryl J Collins
(74) *Attorney, Agent, or Firm*—Sughrue Mion, PLLC

(57) ABSTRACT

An optical imaging system for a microlithography projection exposure system is used for imaging an object field arranged in an object plane of the imaging system into an image field arranged in an image plane of the imaging system. A projection objective or a relay objective to be used in the illumination system can be involved, in particular. The imaging system has a plurality of lenses that are arranged between the object plane and the image plane and in each case have a first lens surface and a second lens surface. At least one of the lenses is a double aspheric lens where the first lens surface and the second lens surface is an aspheric surface. Lenses of good quality that have the action of an asphere with very strong deformation can be produced in the case of double aspheric lenses with an acceptable outlay as regards the surface processing and testing of the lens surfaces.

24 Claims, 12 Drawing Sheets

U.S. PATENT DOCUMENTS

| | | |
|---|---|---|
| 6,104,472 A | 8/2000 | Suzuki |
| 6,366,410 B1 | 4/2002 | Schultz et al. |
| 6,486,940 B1 | 11/2002 | Williamson |
| 6,646,718 B2 * | 11/2003 | Schuster et al. ............... 355/67 |
| 6,707,616 B1 | 3/2004 | Takahashi et al. |
| 2002/0039175 A1 | 4/2002 | Shafer et al. |
| 2002/0171944 A1 | 11/2002 | Suenaga et al. |
| 2003/0002172 A1 | 1/2003 | Ohtake et al. |
| 2003/0030916 A1 | 2/2003 | Suenaga |
| 2003/0048547 A1 | 3/2003 | Schuster |
| 2003/0179356 A1 | 9/2003 | Schuster et al. |

FOREIGN PATENT DOCUMENTS

| | | |
|---|---|---|
| DE | 100 02 626 A1 | 7/2001 |
| EP | 0 851 304 A2 | 7/1998 |
| EP | 0 869 383 A2 | 10/1998 |
| EP | 1 061 396 A2 | 12/2000 |
| EP | 1 079 253 A1 | 2/2001 |
| EP | 1 174 749 A2 | 1/2002 |
| EP | 1 316 832 A1 | 6/2003 |
| EP | 1 242 843 B1 | 3/2006 |
| WO | WO 99/52004 A1 | 10/1999 |
| WO | WO 01/50171 A1 | 7/2001 |
| WO | WO 02/12924 A2 | 2/2002 |
| WO | WO 02/052346 A1 | 7/2002 |
| WO | WO 03/077036 A1 | 9/2003 |

* cited by examiner

LITHOGRAPHY LENS SYSTEM AND PROJECTION EXPOSURE SYSTEM PROVIDED WITH AT LEAST ONE LITHOGRAPHY LENS SYSTEM OF THIS TYPE

This application is a National Stage of International Application No. PCT/EP2004/007753, filed Jul. 14, 2004, which claims benefit of German Application No. 103 41 986.1, filed Sep. 9, 2003.

The invention relates to an optical imaging system for a microlithography projection exposure system for imaging an object field arranged in an object plane of the imaging system into an image field arranged in an image plane of the imaging system, and to a microlithography projection exposure system comprising at least one such optical imaging system.

Microlithography projection exposure systems are used for the microlithographic production of semiconductor components and other finely structured subassemblies. A projection exposure system has an illumination system and a projection objective downstream of the illumination system. The task of the illumination system is to prepare the light of a primary light source, for example a laser, such that a mask (reticle) that is arranged in an exit plane of the illumination system and has a pattern to be imaged can be illuminated in a way that can be prescribed in definite terms. The mask is located in the object plane of the downstream projection objective whose task it is to image the pattern of the mask with the highest possible resolution onto an object coated with a photosensitive layer, for example a semiconductor wafer coated with a photoresist layer, with the highest possible resolution.

A projection objective for microlithography is a complex diffraction-limited optical imaging system comprising a plurality of lenses whose number and diameter typically increase the higher the requirements made of the resolving capability and of the optical correction. Modern projection objectives that are designed for resolving typical structure sizes of 100 nm or below and operate with ultraviolet light from the deep ultraviolet (DUV) region frequently have more than twenty lenses that are further supplemented by at least one imaging concave mirror in the case of catadioptric systems.

At least one optical imaging system is likewise normally provided inside the illumination system in order to image an illumination field arranged in an intermediate field plane of the illumination system into the exit plane of the illumination system. An essential task of such an imaging system is to adapt the properties of the illumination light with regard to field size and beam path to the entrance-end requirements of the downstream projection objective. The setting of the telecentricity of the illumination light plays an essential role here. Such imaging systems are frequently denoted as relay objectives. If the object is used to image an intermediate field plane, equipped with a reticle masking device (REMA), of the illumination system into the exit plane of the illumination system or onto the reticle, the designation REMA objective is also used. These imaging systems also have a complex design comprising a plurality of lenses, which in some cases can have larger diameters.

Attempts have already been made for some time to achieve a more advantageous design of the imaging systems mentioned at the beginning by using aspheric surfaces (aspheres). An aspheric surface is an optical surface that is used to reflect or refract a light bundle and is neither spherical nor flat. It is known that aspheric surfaces produce additional degrees of freedom in the possibilities of correction that can be used for an improved optical correction and/or for a reduction in the number of surfaces, and/or in order to provide particular optical properties.

U.S. Pat. No. 4,906,080 exhibits a projection exposure system comprising an illumination system and a downstream projection objective. In order to adapt the light provided by the illumination system to the projection objective, the illumination system includes an imaging system having at least one aspheric surface that is calculated such that the principal ray angles of the radiation output by the illumination system substantially correspond to the principal ray angles of the downstream projection objective. In order to ensure this adaptation to the telecentricity requirements of the projection objective, in one embodiment the last lens surface facing the exit plane or image plane of the imaging system is an aspheric surface whose surface form substantially determines the ray angle adaptation.

Patent application EP 1 316 832 (corresponding to WO 02/14924) exhibits a relay objective for an illumination system of a projection exposure system in which in order to reduce the number of lenses and to reduce weight while retaining its optical properties, a number of aspheric surfaces are provided, at least one of the aspheres being arranged in the vicinity of the object plane or in the vicinity of the image plane, that is to say in the vicinity of a field plane.

Patent application US 2002/0171944 A1 exhibits an illumination system for a projection exposure system in which a relay objective is provided that is subdivided into three lens groups. A first lens group closest to the object plane has a negative lens with a concave surface pointing toward the object plane, a second lens group with a positive lens, and a third lens group. At least one of the lens surfaces in the first lens group is aspheric.

German patent application DE 196 53 983 (corresponding to U.S. Pat. No. 6,366,410) exhibits a REMA objective where the use of fewer aspheric surfaces succeeds in reducing the number of the interfaces inside the system that lead to reflection losses, and in reducing the glass path inside the system that determines the absorption by comparison to the prior art such that a substantially improved transmission efficiency is achieved. One lens surface is respectively aspheric in the case of the asphered lenses. In some embodiments, aspheric surfaces are arranged both in the vicinity of a pupil plane of the imaging system and in the vicinity of the object plane and/or the image plane.

Patent EP 0 869 383 B1 exhibits a double-focusing catadioptric projection objective with an intermediate image where a lens with an aspheric lens surface is arranged in the vicinity of a field plane, and a lens with an aspheric lens surface is arranged at a vast distance from a field plane in the vicinity of a pupil plane. The aim of using these aspheric lenses is to be able to correct the distortion and the aspherical aberration simultaneously without other aberrations being disadvantageously influenced.

European patent application EP 1 079 253 (corresponding to WO 99/52004) exhibits catadioptric projection objectives for a wavelength region of less than 180 nm in the case of which four or more aspheric surfaces are provided for supporting the optical correction. Because of the high number of aspheres, the mutually facing lens surfaces of adjacent lenses are aspheric surfaces at a number of points in the case of some embodiments.

Patent application U.S. 2003/0030916 A1 exhibits various refractive projection objectives that are designed as three-belly systems with three bellies and two waists lying therebetween, and have a plurality of aspheres. The aspheric surfaces are concentrated in the waist regions, four consecutive aspheres being provided in the vicinity of the waist in one embodiment.

EP 0 851 304 A2 discloses the adjacent arrangement of aspheric lens surfaces of adjacent lenses in a projection objective. The mutually facing, aspheric surfaces are positioned in the region of a pupil plane of the projection objective, and are not rotationally symmetrical. They are mounted such that they can be displaced relative to one another in a radial direction. The difference between the mutually facing aspheric surfaces, and thus the combined action of the aspheric surfaces, is varied by the relative displacement. The aim thereby is to be able to set the optical imaging properties of the projection objective in a variable fashion.

The international patent application WO 01/50171 (corresponding to EP 1 242 843) exhibits refractive projective objectives that are designed as three-belly systems having three bellies and two waists lying between the bellies. There is a pair of lenses with mutually facing, aspheric lens surfaces in the region of the waist between a first lens group, following the object plane, of positive refractive power and a second lens group, following thereupon, of negative refractive power. This arrangement of aspheric lens surfaces arranged adjacent to one another on various lenses is also denoted there as a "double asphere". By comparison with precursor systems, the use of at least one double asphere in the region of the first belly rendered it possible to correct input telecentricity and distortion with the aid of modest means over a short distance, an increase in the image-side numerical aperture having been achieved at the same time.

The advantageous actions of aspheres result essentially because it is possible with the aid of aspheric lens surfaces to set a specific variation, which cannot be achieved by spherical lens surfaces, in the radial refractive power profile by suitable deformation of the asphere. In order here to achieve an optimum degree of freedom for the optical design by the use of aspheres, aspheres with strong deformations are increasingly becoming required. However, this results in problems, since the fabrication of aspheric lens surfaces with strong deformations comes up against technological limits both with regard to the processing of the aspheric lens surface and with regard to the testing of the aspheric lens surface.

It is an object of the invention to provide an optical imaging system for a microlithography projection exposure system that includes a number of aspheric lens surfaces for influencing its imaging properties, the production and testing of the aspheric surfaces being simplified by comparison with the prior art.

The invention provides an optical imaging system having the feature of claim 1 in order to achieve this object. Advantageous developments are specified in the dependent claims. The wording of all the claims is incorporated in the description by reference.

An optical imaging system according to the invention for a microlithography projection exposure system is used to image an object field arranged in an object plane of the imaging system into an image field arranged in an image plane of the imaging system. The optical imaging system comprises:
a plurality of lenses that are arranged between the object plane and the image plane and in each case have a first lens surface and a second lens surface,
at least one of the lenses being a double aspheric lens where the first lens surface and the second lens surface is an aspheric surface.

The optical imaging system that is also denoted below as a "lithography objective" therefore has at least two aspheric surfaces that are provided at one and the same lens such that both the entrance surface of the lens, and the exit surface of the lens are aspherically curved Such a lens is also denoted below as a "biasphere".

The inventors have found that it is possible by using double aspheric lenses of this type to provide lenses that have the action of an asphere with very strong deformation, and that can nevertheless be designed so that they can be produced with good quality and an acceptable outlay by using conventional methods for finishing and for testing the surfaces. If appropriate, a strong radial profile of the refractive power of an asphere can be produced by aspherization of the two lens surfaces of a lens. The contribution of the individual aspherical lens surfaces to the refractive power profile, and the deformation, attendant thereon, of the individual surfaces can nevertheless be kept so small that the surfaces can be produced and tested with an acceptable outlay.

In some embodiments, the first lens surface and the second lens surface of the double aspheric lens are shaped to be symmetrical relative to one another. A strong aspheric action can be achieved in this way in conjunction with minimal deformation. Symmetrical double aspheric lenses are also advantageous with regard to fabrication and testing, since substantially the same production and testing process can be used for both lens surfaces.

The double aspheric lens can be a biconvex positive lens or a biconcave negative lens. Also possible are embodiments where the double aspheric lens is a meniscus lens, that is to say a lens in which the first lens surface and the second lens surface have the same sense of curvature. Double aspheres can also be formed as a planarconvex lens or planarconcave lens with a substantially flat, yet aspherized first lens surface and an aspherically curved second lens surface as well as a plane-parallel plate with an aspheric component on both sides.

It has proved to be advantageous with regard to simplified fabrication and testing when the first lens surface and the second lens surface of the double aspheric lens have substantially the same surface description with reference to curvature and aspheric constants. They can thus be substantially of identical shape.

A simplified testing can be achieved by shaping a first aspheric lens surface and a second aspheric lens surface such that they can substantially be transformed into one another by means of an orthotomic projection. With reference to a surface of prescribed surface shape, an orthotomic light bundle is a light bundle whose rays are in each case normals to the surface onto which the light bundle falls. If use is made when testing aspheres of test optics that are shaped such that the emerging light falls substantially perpendicular to the aspheric surface to be tested, such a test optics can be used unchanged for the purpose of testing aspheres of different size as long as their aspheric surfaces can be transformed into one another by an orthotomic projection.

In general, first and second aspheric lens surfaces are advantageous when both surfaces are "similar" aspheres in the sense that they can be tested with the same test optics, if appropriate given a different working distance or testing distance.

The advantages that are afforded thereby, namely that at least two aspheric lens surfaces inside an optical imaging system have an essentially identical surface description with reference to curvature and aspheric constants, and/or can substantially be transformed into one another by means of an orthotomic projection, and/or are substantially shaped such that they can be tested with the same test optics, can be utilized not only when using double aspheric lenses according to the invention. Rather, mutually similar or identical aspheres can also be arranged on various lenses of an imaging system, if appropriate at a large distance from one another and/or with at least one optical surface lying therebetween. The advantages are retained with regard to the ability to produce and test.

In one development of the invention, the double aspheric lens is arranged in a region of the imaging system close to a field and therefore acts as a field lens. A "region close to a field" in this sense is, in particular, a region that lies in the vicinity of a field plane of the imaging system and in which the marginal ray height of the optical imaging is smaller than or small by comparison with the principal ray height. In the region close to a field, the marginal ray height is typically less than 50%, 40%, 30%, 20% or 10% of the marginal ray height in the region of an aperture-limiting stop. An effective correction of distortion as well as a setting of the telecentricity in the closest field plane is possible with the aid of double aspheric lenses close to a field.

There are embodiments in which the imaging system is a relay objective or REMA objective for imaging an illumination field arranged in an intermediate field plane of an illumination system into an exit plane of the illumination system. It has proved to be advantageous here when the double aspheric lens is the last one of the imaging system, closest to the image plane. As a result, the central function of such objectives, specifically the compensation of the telecentric error of the subsequent projection objective, is optimally fulfilled without the need to fabricate aspheric lenses with excessively strong deformation. The symmetrical shaping already mentioned has proved to be advantageous in order to achieve the desired aspheric action by comparison with conventional systems having a substantially lesser local curvature at the surface. Since the aspheres enable a large variation in the radial refractive power profile in conjunction with moderate deformation of the individual surfaces within a short installation space, biaspheres close to a field enable the generation and/or compensation of large telecentric errors.

Whereas in some embodiments the exit-side double asphere is, if appropriate, a symmetrical biconvex lens, other embodiments the double asphere closest to the exit plane is shaped as a meniscus lens, in particular with a concave side directed toward the object, that is to say with an image-side convex surface.

In accordance with one development, the imaging system is a projection objective for imaging a pattern of a mask arranged in an object plane of the projection objective into the image plane of the projection objective. The projection objective can be a rotationally symmetrical, purely refractive projection objective. Although systems with three or more bellies between the object plane and image plane are also possible, a preferred projection objective is designed as a two-belly system having an object-side belly, an image-side belly and a waist lying therebetween. Such a system has a first lens group, following the object plane, of negative refractive power, a second lens group, following thereupon, of positive refractive power, a third lens group, following thereupon, of negative refractive power, a fourth lens group, following thereupon, of positive refractive power, and a fifth lens group, following thereupon, of positive refractive power, a system aperture being arranged in the transition region between the fourth and fifth lens group. The double aspheric lens can be arranged in the vicinity of the object plane, in particular inside the first lens group. In one embodiment, the double aspheric lens has negative refractive power, it being shaped as a biconcave meniscus lens, in particular. If a double aspheric lens is the lens of the imaging system that is closest to the object plane, a particularly strong influence on telecentricity and the correction of distortion is possible in a small installation space.

The invention can also be used in catadioptric systems with or without an intermediate image, in particular in systems having a geometric beam splitter or a physical, polarization-selective beam splitter. For example, a double aspheric lens close to a field can be present in the entrance region close to the object plane or in the vicinity of the intermediate image.

The invention can equally well be used for "air objectives" and for "immersion objectives". An air objective in this sense is a projection objective in which during operation an interspace filled with air or another gas exists between the image-side exit surface and the image plane. By contrast, an immersion objective is distinguished by the fact that during operation the interspace between an exit side of the objective and the image plane is filled with an immersion medium of high refractive index, for example an immersion liquid such as water, perfluoropolyether (PFPE) or the like. Image-side numerical apertures of $NA \geqq 1$ are possible in this case.

The aim when shaping the aspheric lens surfaces with regard to fabrication and testing is as slight as possible deformations. The "deformation" of an aspheric lens surface is defined here as the extent of the deviation of a spherical lens surface (enclosing sphere), adapted in the best way to the aspheric surface, of the aspheric lens surface. The enclosing sphere is laid in this case such that it touches the aspheric lens surface at its apex and at the outer edge. With regard to fabrication, it is customary to determine the extent of the deformation, that is to say the distance between the enclosing sphere and aspheric surface, in a radial direction of the enclosing sphere. From the point of view of optical design, the deformation is alternatively specified as distance in the axial direction. The last-named definition is used in this application.

In the sense of this application, aspheres are, in particular, so-called "design aspheres" that are provided from the beginning in the optical design for the purpose of optimizing the system. Such design aspheres typically have maximum deformations of clearly more than 1 to 5 μm, and differ from so-called "correction aspheres", which are inserted subsequently, if appropriate, into optical imaging systems in order to correct aberrations. Aspheres are, in particular, all optical surfaces with a rotationally symmetrical deviation from the enclosing sphere where the deviation is more than 5 μm. Useful deviations are predominantly of the order of magnitude of 0.1 mm to 1 mm.

In the case of advantageous embodiments, aspheric surfaces are. possible for which the maximum deformation is less than 500 μm, in particular less than 400 μm or less than 300 μm. This facilitates the fabrication and testing of the aspheres.

The invention also relates to a design method for producing an optical imaging system for a microlithography projection exposure system, the imaging system being provided for imaging an object field arranged in an object plane of the imaging system into an image field arranged in an image plane of the imaging system, and having a plurality of lenses that are arranged between the object plane and the image plane, and it being permitted to provide an aspheric effect of at least one aspheric optical surface in order to influence the imaging. In the method, a first aspheric lens surface and at least one second aspheric lens surface are calculated by means of appropriate algorithms in a calculation program such that a combination of the first and the second aspheric lens surfaces is formed in order to produce the aspheric effect, and that the first aspheric lens surface and the second aspheric lens surface are deformed similarly in such a way that they can be tested with the same test optics. The method can be integrated into existing computer programs by means of suitable programming.

Apart from proceeding from the claims, the existing and further features also proceed from the description and the drawings, it being respectively possible to implement the individual features on their own or severally in the form of subcombinations in one embodiment of the invention and in other fields, and to constitute advantageous designs that are patentable per se.

FIG. 14 shows a schematic of the effect of various shapings of aspheres on the shape of a wavefront passing through;

In the following description of preferred embodiments, the term "optical axis" denotes a straight line through the centers of curvature of the spherical optical components or through the axes of symmetry of aspheric elements. Directions and distances are described as being on the image side or as toward the image when they are pointed in the direction of the image plane, and as on the object side or toward the object when they are directed toward the object with reference to the optical axis.

Figure 1:
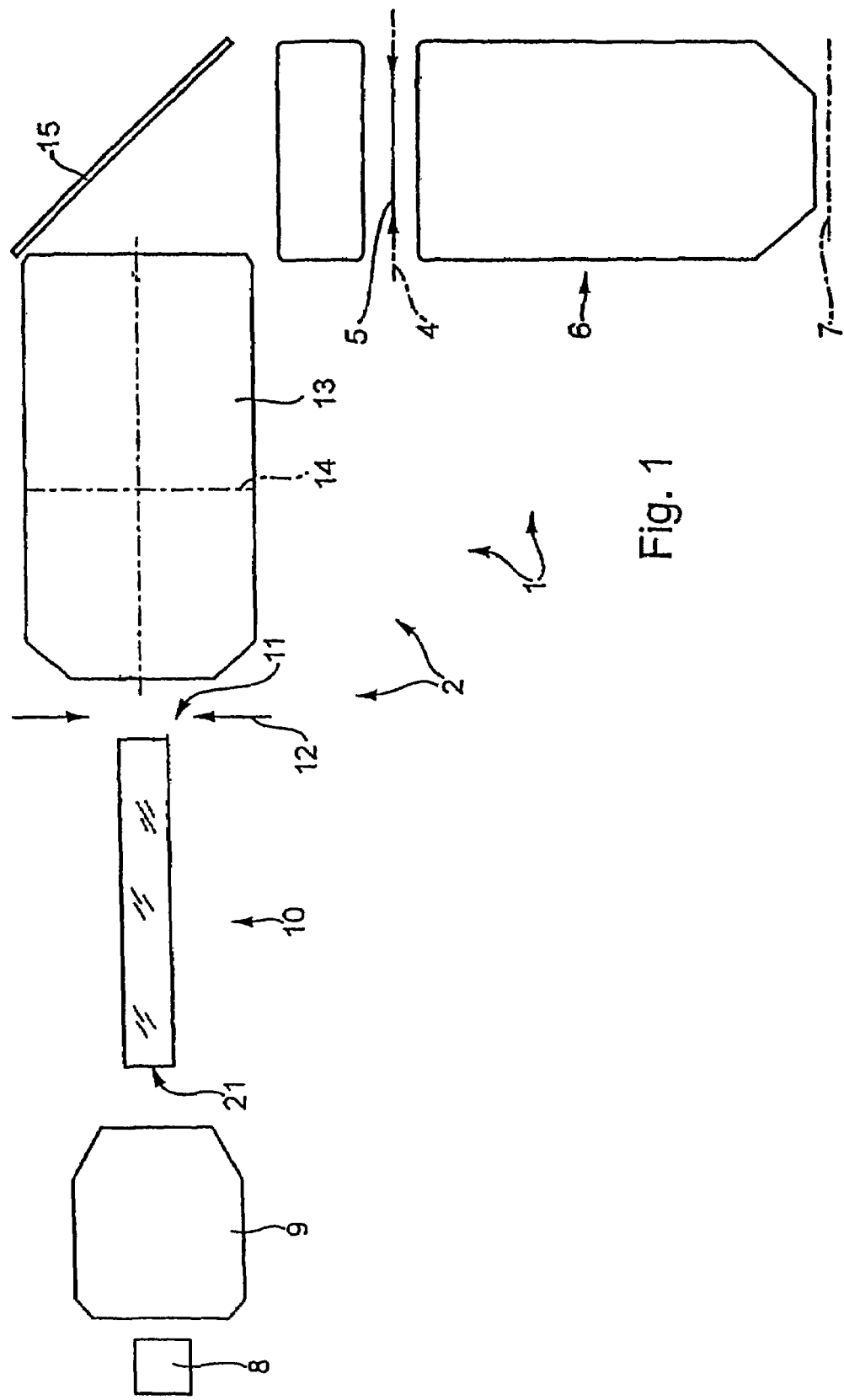
FIG. 1 shows a schematic of an embodiment of a projection exposure system for microlithography.

FIG. 1 shows an exemplary embodiment of a projection exposure system 1 for microlithographic production of integrated semiconductor components and other finely structured subassemblies at resolutions of up to 0.1 µm or below. The projection exposure system 1 comprises an illumination system 2 for illuminating a photomask 5 (reticle) arranged in the exit plane or image plane 4 of the illumination system, as well as a projection objective 6 that is provided for the purpose of imaging the pattern of the photomask arranged in its object plane 4 into the image plane 7 of the projection objective on a reducing scale. A semiconductor wafer coated with a photosensitive layer is located in the image plane 7 as an object to be exposed.

Serving as a light source of the illumination system 2 is a laser 8, for example an excimer laser, customary in the deep ultraviolet (DUV) region and having an operating wavelength of 248 nm, 193 nm or 157 nm. The light of the output light beam is largely linearly polarized. A subsequent optical device 9 shapes the light of the light source and transmits it into a subsequent light mixing device 10. In the example shown, the optical device 9 comprises a beam expander that is downstream of the laser 8 and serves the purpose of reducing coherence and shaping the beam to a rectangular beam cross section with an aspect ratio x/y of its side lengths of more than one. A first diffractive optical raster element subsequent to the beam expander is seated in the object plane of a subsequent zoom objective, in whose exit pupil a second optical raster element is provided. From the latter, the light enters an encoupling optics that transmits the light into the light mixing device. The light is mixed and homogenized inside the light mixing device 10 by multiple internal reflection, and exits at the exit 11 of the light mixing device in a largely homogenized fashion. Arranged directly at the exit of the light mixing device is an intermediate field plane in which a reticle masking system (REMA) 12, an adjustable field stop, is arranged. The subsequent objective 13, which is also denoted as REMA objective, has a number of lens groups, a pupil plane 14 and a deflecting mirror 15, and images the intermediate field plane of the reticle masking system onto the reticle or the photomask 5.

The design of the previously described illumination system can substantially correspond to the design described in EP 0 747 772, the disclosure content of which is incorporated in this description by reference.

The entrance plane 21 of the light mixing device 10, which coincides with the rear focal plane of the upstream encoupling optics is a field plane of the illumination system. The exit plane of the light mixing device, in the region of which the reticle masking system 12 is arranged, is likewise a field plane. In other embodiments with a similar basic design, the optical devices present up to the exit plane of the encoupling optics are shaped such that the illumination distribution within this field plane is sufficiently uniform. No separate light mixing device is provided in the case of these embodiments, and so the reticle masking system can be arranged directly in the region of the exit plane of the encoupling optics.

Figure 2:
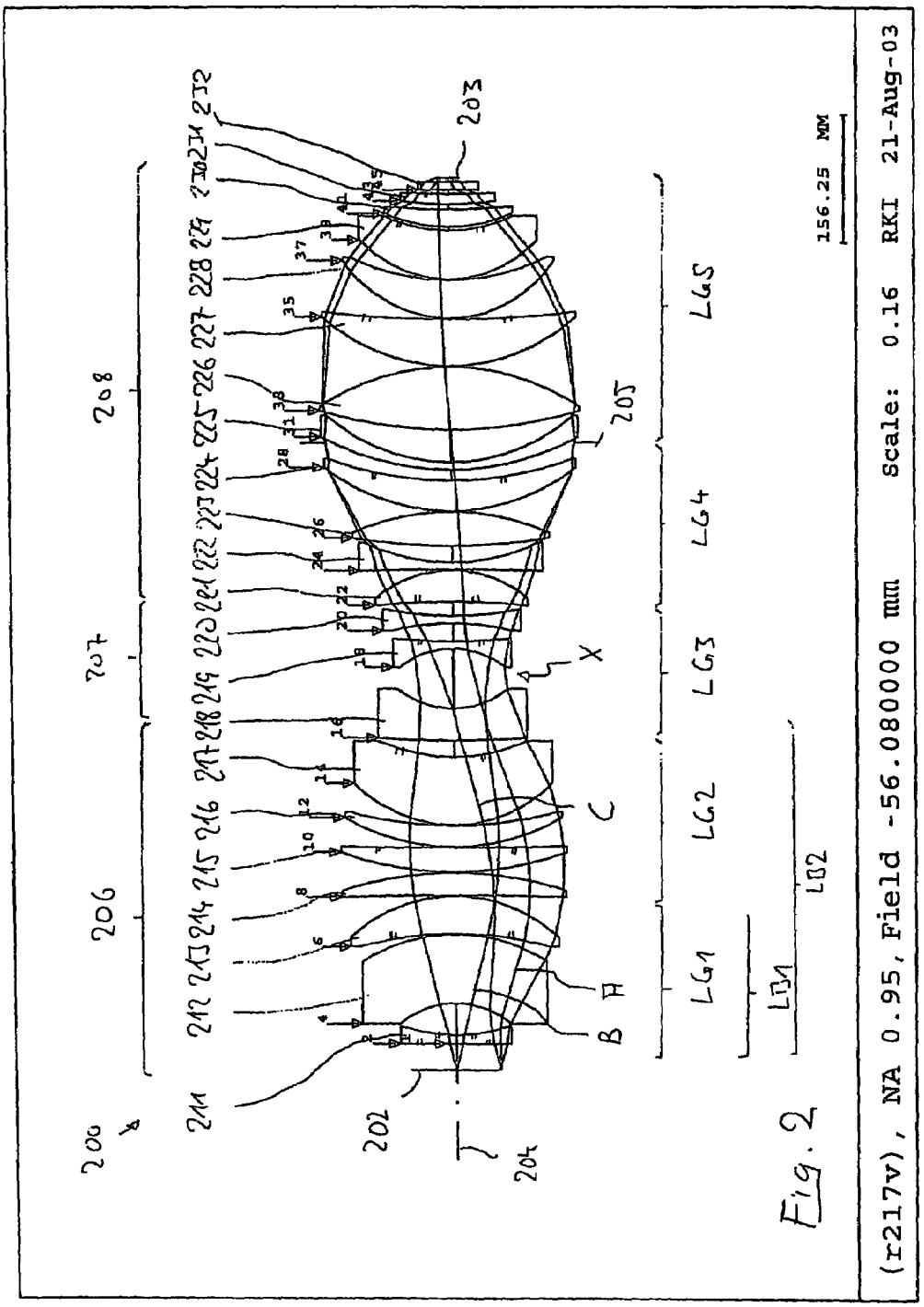
FIG. 2 shows an embodiment of an inventive imaging system that is designed as a refractive two-belly projection objective.

A typical design of an embodiment of an inventive, purely refractive reduction objective 200 is shown in FIG. 2. It serves the purpose of imaging a pattern, arranged in its object plane 202, of a reticle or the like into an image plane 203 on a reduced scale, for example, on the scale 4:1 (linear magnification $\beta=0.25$). This is a rotationally symmetrical one-wayist system or two-belly system with five consecutive lens groups that are arranged along the optical axis 204 perpendicular to the object plane and image plane. The first lens group LG1 following the image plane 202 has negative refractive power (with a focal length of −546.86 mm). A second lens group LG2 following thereupon has positive refractive power (with a focal length of 205.97 mm). A third lens group LG3 following thereupon has negative refractive power (and a focal length of −55.62 mm). A fourth lens group, following thereupon, has positive refractive power (and a focal length of 216.53 mm). A fifth lens group LG5, following thereupon, has positive refractive power (and a focal length of 121.10 mm). This distribution of refractive power produces a two-belly system that has an object-side belly 206, an image-side belly 208 and a waist 207 that lies therebetween and in which a site of constriction X with a minimum beam diameter lies. The system aperture 205 lies in the region of relatively large beam diameters in a transition region from the fourth lens group to the fifth lens group.

The imaging possible with the aid of the projection objective can be characterized by the course of its principal rays and marginal rays. Denoted here as principal ray A is a ray that runs from an outer marginal point of the object field in a fashion parallel, or at an acute angle, to the optical axis, and cuts the optical axis 204 in the region of the system aperture 205. A marginal ray B leads from the middle of the object field, that is to say from an axial field point, to the edge of an aperture stop that is normally seated at the location of the system aperture 205 or in the immediate vicinity thereof. A ray C, that leads from an outer field point to the opposite edge of the aperture stop, is denoted here as a coma ray. The perpendicular distance of these rays from the optical axis yields the corresponding ray heights $h_A$, $h_B$ and $h_C$.

A first lens region LB1 begins at the object plane 202 and ends in the plane in which the marginal ray B and the coma ray C intersect such that the condition $|h_B/h_C|<1$ is fulfilled in the first lens region LB1. The principal ray height is large by comparison with the marginal ray height in this lens region LB1. The lens surfaces arranged here are denoted as "particularly close to a field". A second lens region LB2 extends from the object plane 202 as far into the region in which the principal ray height and the marginal ray height are approximately equal in terms of magnitude, it applying, in particular, that $|h_B/h_A|<1.2$. In typical variants of inventive projection systems, the length of the second lens region LB2 is smaller than one third of the distance L between the object plane 202 and image plane 203. This object/image distance is also denoted as the design length of the projection objective.

The first lens group LG1 following the object plane 202 is substantially responsible for expanding the light bundles in the first belly 206. A negative lens 211 with a convex entrance side relative to the object plane and a concave exit side on the image side is provided as first lens directly following the object plane 202. Both lens surfaces (surfaces 2 and 3 in Table 1) are aspheric surfaces, and so the negative lens 211 is also denoted here as a "double aspheric lens" or "biasphere".

There follows a double spherical meniscus lens 212 of weak refractive power and, downstream thereof, a positive meniscus 213 with an object-side aspheric concave surface. The aspheric surfaces, arranged particularly close to the field, of the double aspheric lens 211 contribute to the good correction of the distortion and of the astigmatism, and provide support for the correction with regard to telecentricity.

The second lens group LG2 comprises four positive lenses 214, 215, 216, 217. An entrance-side meniscus lens 214 with a virtually flat, object-side concave entrance surface and spherical exit surface is followed by a further virtually planarconvex positive lens with a spherical entrance surface and a virtually flat aspheric exit surface. Following thereupon are a double spherical positive meniscus 216, a thick positive meniscus lens 217 with a spherical entrance surface and an aspheric exit surface that is concave on the image side. This design, in which the curvatures of the lens surfaces on the object side and image side of a plane lying between the lenses 214, 215 run in opposite directions and with concave surfaces averted from one another, ensures small surface loadings for the meniscuses and the positive lenses and thus slight aberrations.

The third lens group LG3 comprises three negative lenses 218, 219, 220. A double spherical meniscus lens 218 with a concave surface on the image side is followed by a negative meniscus lens 219 which is concave on the object side and has an image-side asphere and a double spherical biconcave lens 220. The location X of narrowest constriction inside the waist 207 lies in the entrance region of the lens 219.

The fourth lens group LG4 starts with a positive meniscus lens 221, concave relative to the object plane, with an aspheric entrance surface that is followed by a negative meniscus 222 with a virtually flat entrance surface and spherical exit surface concave on the image side. Seated behind a subsequent double spherical biconvex lens 223 is a positive meniscus 224, concave relative to the image plane, with a spherical entrance side and aspheric exit side. Striking inter alia are the large incident angles, occurring on the exit side of the meniscus 222, in the region of the divergent ray bundle, which contribute to the correction.

The fifth lens group LG5 starts with a double spherical negative meniscus 225 with an image-side concave side that projects into the region of the system aperture. Following this are six positive lenses 226, 227, 228, 229, 230, 231, of which the first lens 226 is biconvex, while the remaining are designed as positive meniscuses concave on the image side. The exit sides of the lenses 227 and 229 are aspheric, while the other lens surfaces are spherical. The system ends with a plane-parallel plate 232.

The double telecentric system has an object-side operating distance of approximately 32 mm and an image-side operating distance of 5 mm. The specification of the design is summarized in Table 1 in tabular form in a known way. Here, column 1 specifies the number of a surface distinguished as refractive or in some other way, column 2 specifies the radius r of the surface (in mm), column 3 specifies the distance d, denoted as thickness, of the surface from the subsequent surface (in mm) and column 4 specifies the material of the optical components. Column 5 specifies the refractive index of the lens material, and column 6 specifies the useful, free radii or half the free diameter of the lenses (in mm).

Eleven of the surfaces, particularly the surfaces 2, 3, 6, 11, 15, 19, 22, 29, 36, 38 and 40, are aspheric in the embodiment. Table 2 specifies the corresponding aspheric data, the aspheric surfaces being calculated using the following rule:

$$p(h)=[((1/r)h^2)/(1+SQRT(1-(1+K)(1/r)^2h^2))]+C1*h^4+C2*h^6+\ldots$$

Here, the reciprocal (1/r) specifies the radius of the surface curvature, and h the distance of a surface point from the optical axis (that is to say the ray height). p(h) therefore provides the so-called sagitta, that is to say the distance of the surface point from the apex of the surface in the z-direction, that is to say in the direction of the optical axis. The constants K, C1, C2, . . . are reproduced in Table 2.

The optical system reproducible with the aid of these data is designed for an operating wavelength of approximately 193 nm, at which the synthetic silica glass used for all lenses has a refractive index n=1.5608. The image-side numerical aperture is NA=0.95. The objective has a design length L (distance between the image plane and object plane) of 1101 mm. Given an image size of approximately 14 mm, a light conductance value (product of numerical aperture and image size) of approximately 13.3 mm is reached.

Figure 3:
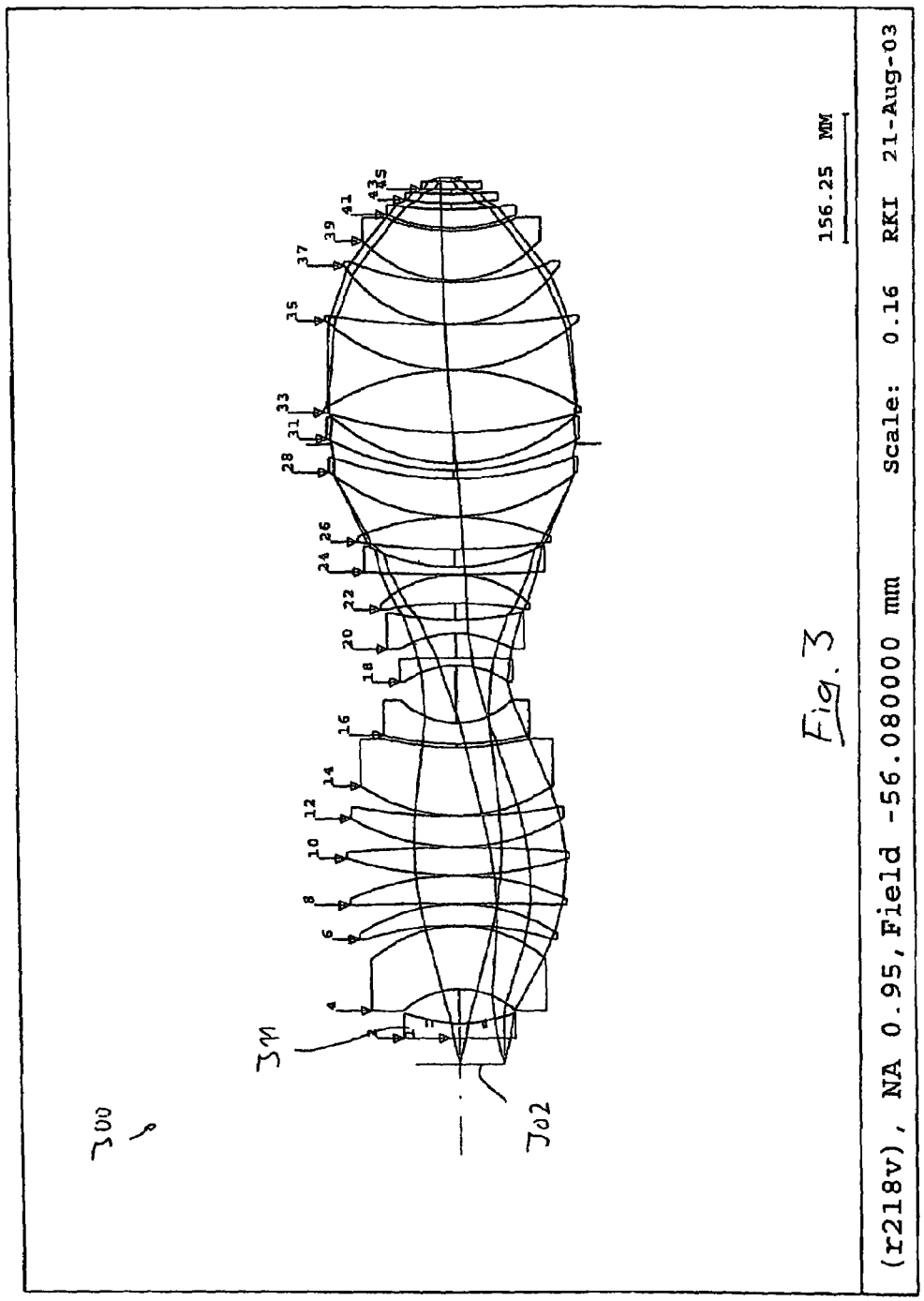
FIGS. 3 and 4 show reference systems relating to the projection objective in accordance with FIG. 2.
Figure 4:
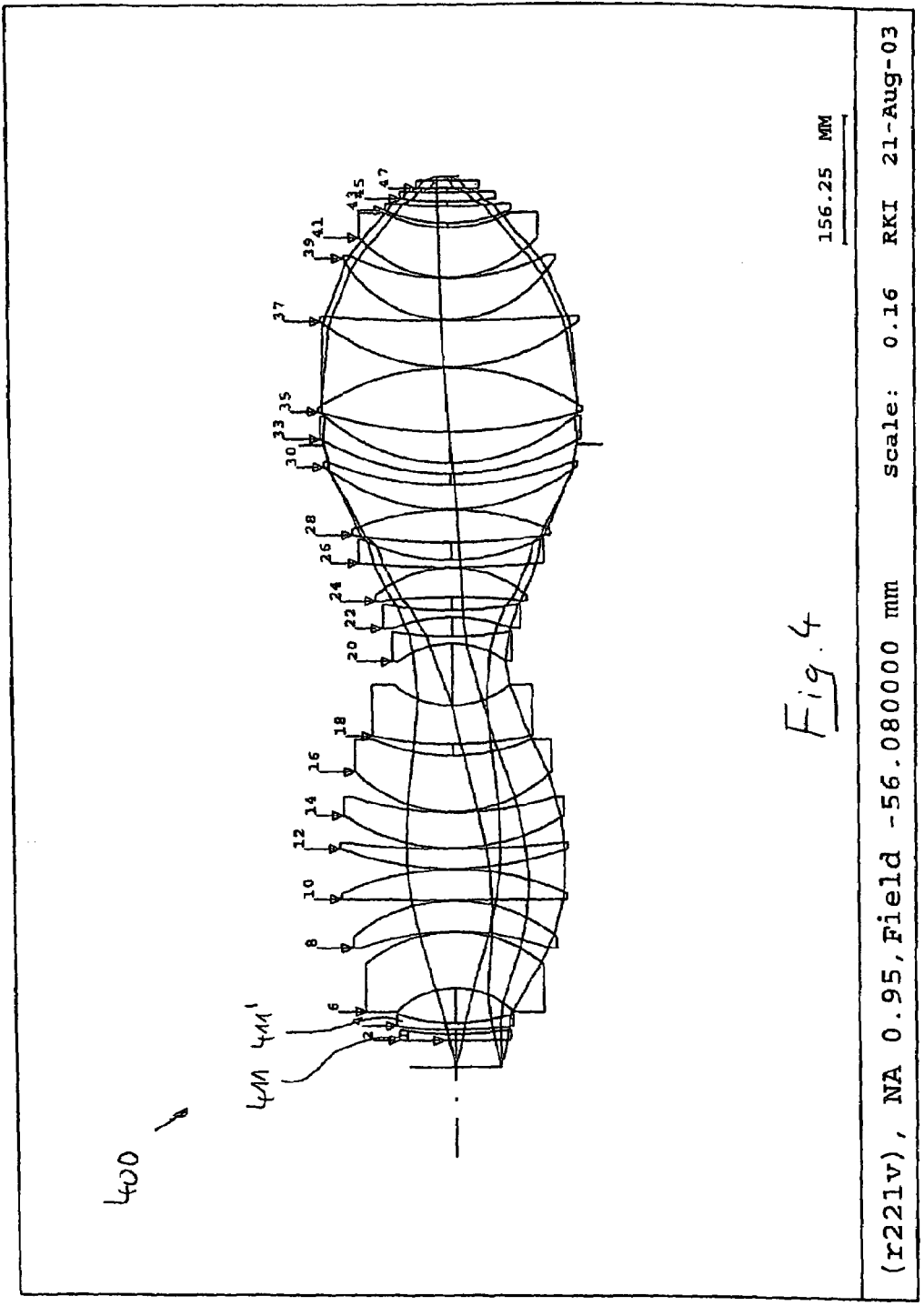

Particular features of this design are now explained in conjunction with FIGS. 3 and 4, which show reference systems that have a virtually identical lens sequence except for the region of the objective entrance. The specifications of the embodiment in FIG. 3 is specified in Tables 3 and 4, those of the embodiment in accordance with FIG. 4 being specified in Tables 5 and 6.

All three systems have substantially the same, good correction state.

In the reference system in FIG. 3, the first lens, next to the object plane 202, is formed by a planarconcave negative lens 311 where the flat entrance surface is followed by a strongly deformed, aspheric exit surface (surface 3 in Table 3). This aspheric surface has a maximum deformation of approximately 1037 μm. The system can be effectively corrected, in particular, even with regard to telecentricity and distortion, with the aid of this strong deformation. However, the deformation is so large as to present difficulties in producing and testing such an asphere.

In the reference system 400 in accordance with FIG. 4, two negative lenses 411, 411' are provided instead of one negative lens 311 in the region close to an object or close to a field. In both negative meniscuses, the entrance side respectively assigned to the object plane is aspherized, while the exit side that is concave relative to the image plane is spherically curved. Since the total deformation in the region near a field that is required for correction is distributed here over two aspheric surfaces (on different lenses), the deformations of the individual aspheric surfaces can be kept substantially smaller than in the example in accordance with FIG. 3, fabrication and testing thereby being facilitated. However, two additional surfaces that can cause light losses are introduced. In addition, stringent requirements are placed on the relative positioning of the aspheric surfaces lying closely next to one another.

The problems occurring with the reference systems can be avoided in the inventive embodiment in accordance with FIG. 2. In the negative lens 211, the total deformation is distributed over the two aspheric lens surfaces such that a biasphere is formed. The deformations of the individual lens surfaces lie in the range below 500 μm. Deformations in this range can be effectively mastered during production and testing, and so such a biasphere can be produced with high quality. The arrangement of the double aspheric lens, acting as field lens, in the direct vicinity of the object plane 202 permits an effective correction of field aberrations.

Alternatively, or in addition, one or more biaspheres can also be provided in other regions of the projection objective, for example in the region of the image-side exit.

FIGS. 5 to 13 are used to describe by way of example the use of biaspheres in the field lens part of REMA objectives with the aid of which in the region of the adjustable stop formed by the REMA system can be imaged inside the illumination system onto the reticle to be exposed on a suitable scale (typically between approximately 1:1 and approximately 1:4 to 1:5). The images are therefore enlarging as a rule, but can also be performed substantially without a change in field size, or even in a slightly reducing fashion.

Figure 5:
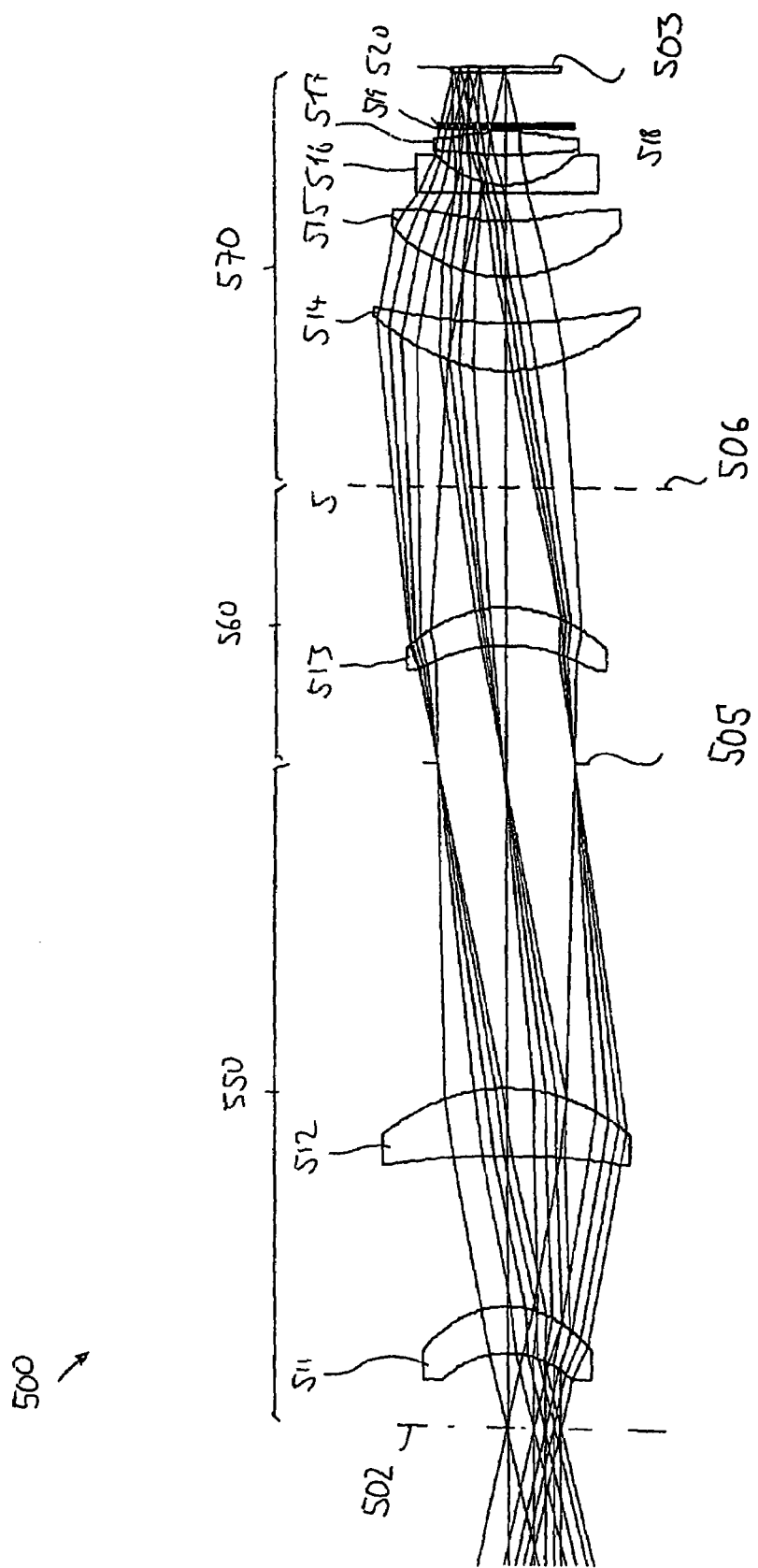
FIG. 5 shows a first embodiment of an inventive imaging system that is designed as a REMA objective for an illumination system of a projection exposure system.

FIG. 5 shows an embodiment of such a REMA objective 500 that is designed for an operating wavelength of 193 nm and an approximately 1:1 imaging (β=0.98). The specification is set forth in Tables 7 and 8. The objective has an object plane 502 in which the reticle masking system is arranged. There follows a condenser part 550 that is upstream of the aperture stop 505 and designed as a partial objective. Beginning downstream of the aperture stop 505 is an intermediate part 560 that extends between the aperture stop and an imaginary plane 506 in which a deflecting mirror for example can be arranged. Beginning downstream thereof is a field lens part 570 that, in the vicinity of the image plane 503 in which a reticle to be exposed is located during operation of the system, comprises a number of lenses arranged in the vicinity of the image field. The air spaces in the region of the object plane 502, in the region of the aperture stop 505, between the intermediate part 560 and the field lens part 570 as well as in the region of the reticle plane or image plane 503 are so generously dimensioned that the parts to be arranged there and, in particular, the REMA system (reference numeral 12 in FIG. 1), correction elements in the stop plane, a deflecting mirror (reference numeral 15 in FIG. 1) and a reticle stage for moving the masks to be arranged in the image plane can be accommodated without a problem.

A principal function of the REMA objective 500 is to image a bright/dark edge, defined by the cutting of the REMA stop, sharply from the object plane 502 onto the reticle plane 503. A further core function of the REMA objective is to adapt the direction of the centroid ray of the emerging rays, down to a few mrad (for example 3 mrad) to the directions of the principal rays of the downstream projection objective. This is equivalent to the requirement of reproducing a prescribed pupil function with the least deviations in the exit plane (reticle plane 503).

Figure 6:
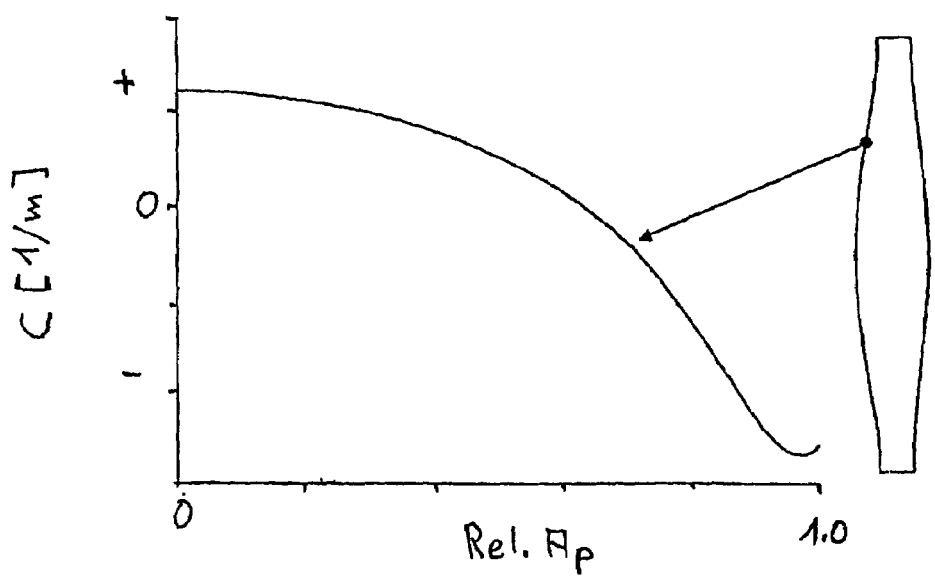
FIGS. 6 and 7 show schematics relating to the dependence of the local curvature C on the relative aperture on aspheric lens surfaces of a symmetrical double aspheric lens.
Figure 7:
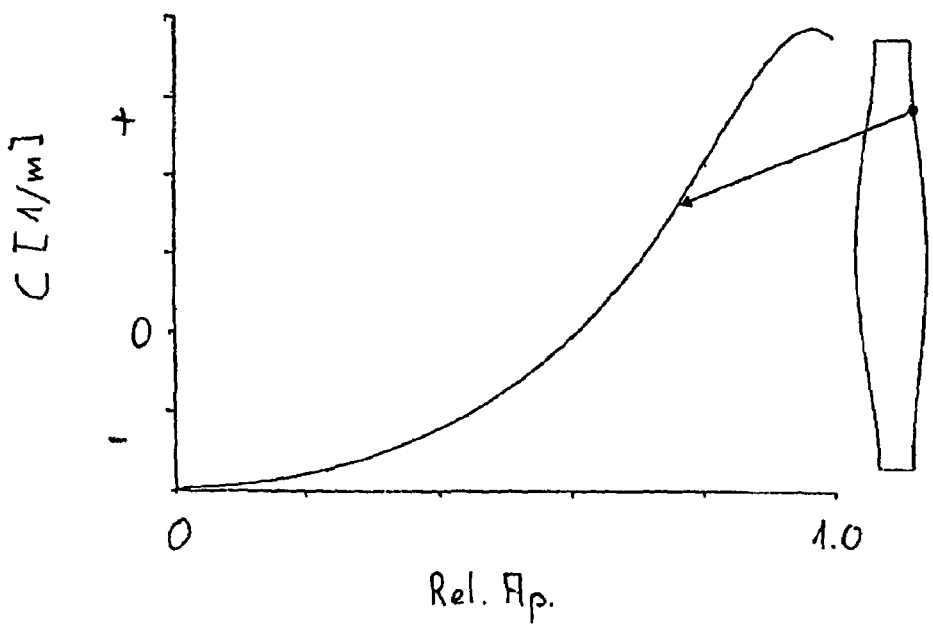

The condenser part 550 comprises a positive meniscus lens 511, concave on the object side, with a spherical entrance surface and exit-side aspheric surface, and a further positive meniscus lens 512 with a spherical entrance surface and exit-side aspheric surface. The intermediate part 560 following downstream of the aperture stop comprises a further positive meniscus lens 513 with a spherical entrance surface and exit-side aspheric surface. The field lens part 570 has a positive meniscus lens 514, concave on the image side, with an aspheric entrance surface and spherical exit surface, a positive meniscus lens 515, concave on the image side, with a spherical entrance surface and spherical exit surface, a diverging planar-concave lens 516 with a flat entrance surface and aspheric exit surface. A double aspheric lens 517 with an aspheric entrance surface and aspheric exit surface is provided at the last, exit-side lens of the REMA objective. Still following downstream thereof are two plane-parallel plates 518, 519 and the reticle 520. The biasphere 517 is of substantially symmetrical design with reference to a plane of symmetry lying perpendicular to the optical axis, such that the aspheric entrance surface and the aspheric exit surface are formed in an essentially mirror-symmetric fashion relative to one another. For the purposes of illustration, in this regard FIG. 6 shows schematically the typical profile of the local curvature C of the entrance side as a function of the relative aperture (Re. Ap.) for the case of a comparable embodiment. FIG. 7 shows the corresponding illustration for the exit side of the biasphere. A comparison of the figures shows the far-reaching symmetry of the curvature profiles.

The system has numerous special features, some of which are described in more detail below. The linear magnification is 1:0.98. All the elements with a center thickness of less than 10 mm are made from $CaF_2$ (n=1.501403 at 193 nm) in order to minimize compaction there. This relates to the filter plates 518, 519, the reticle 520 and the penultimate lens 516. This can be advantageous, because there is the suspicion that thin lenses, in particular, suffer more severely under birefringence owing to compaction. Other lenses are made from synthetic silica glass (n=1.560318). The concave asphere on the exit side of lens 515 is controlled such that its deviations from the curvatures of a sphere do not contain points of inflection. The aspheric surfaces of the double aspheric lens 517, which are principally responsible for the telecentric profile are controlled such that their tangents always preserve the same sign. In order to simplify fabrication, the aspheres of the first four lenses 511 to 514 are respectively on the convex side. The sagging of the lens 513 is kept small in order to save material. The lens 513 close to the pupil is made from $CaF_2$ in order to ensure radiation resistance for small settings. The pupil is optimized to a transverse deviation of less than 0.75 mm. It is thereby possible to introduce a stop in order to limit the settings in order, if appropriate, to minimize scattered light in the case of small settings. The overall length is 1418 mm.

Figure 8:
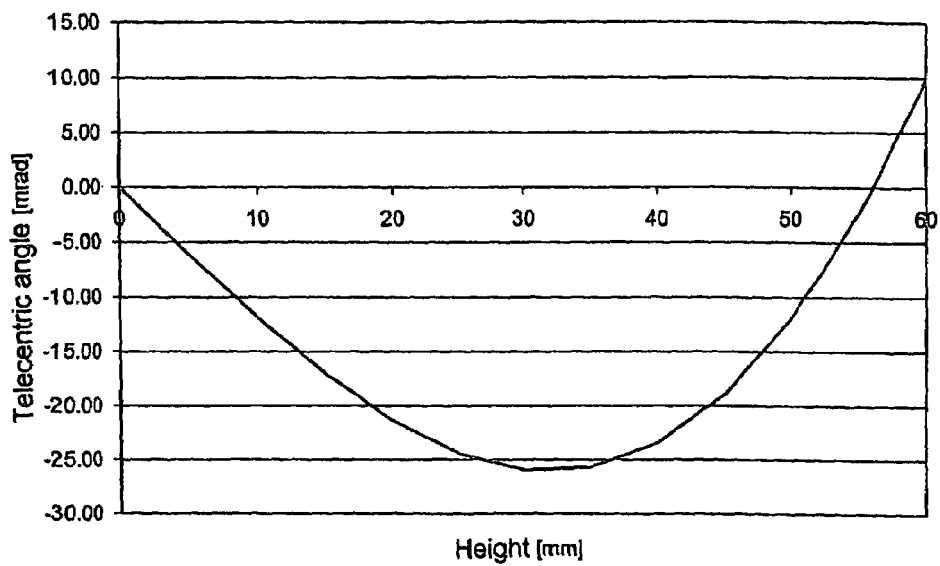
FIG. 8 shows a diagram relating to the pupil function of the REMA objective in accordance with FIG. 5.
Figure 9:
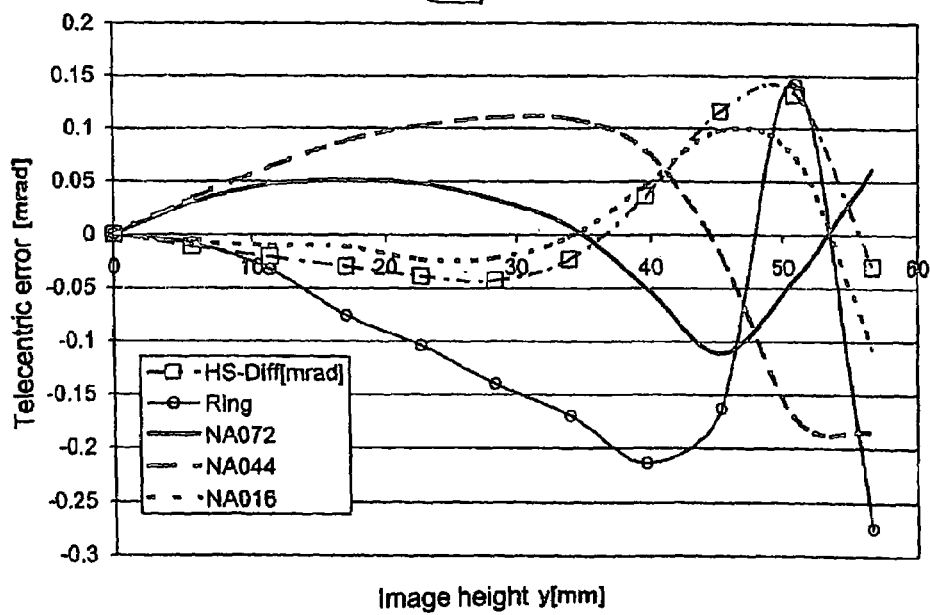
FIG. 9 shows a diagram that illustrates the dependence of the telecentric error on the image height of the REMA objective in accordance with FIG. 5, for various settings.
Figure 10:
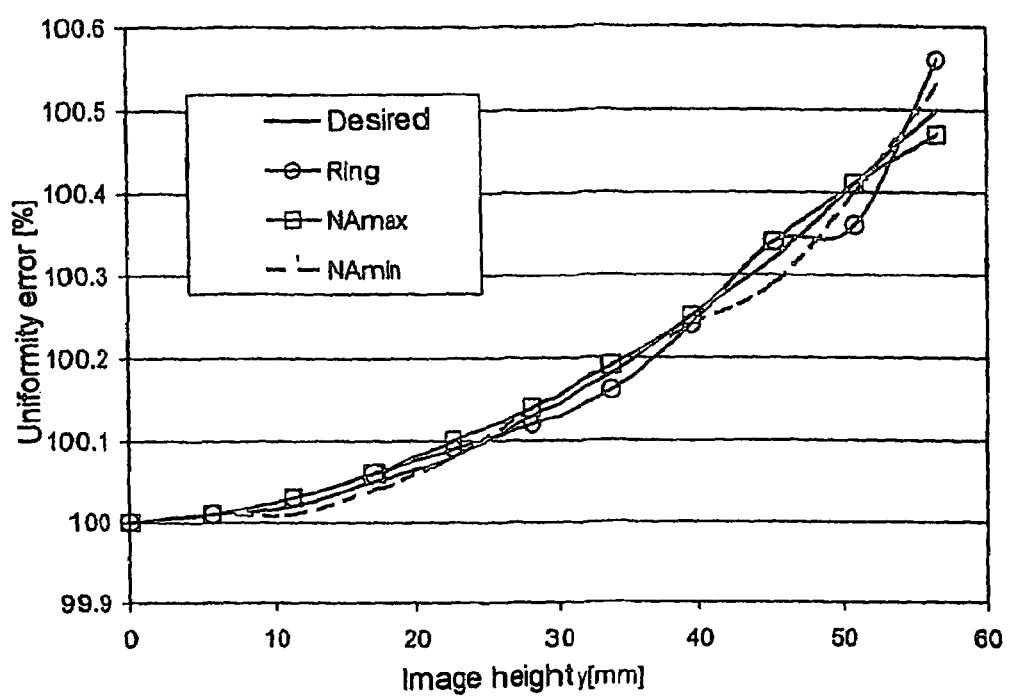
FIG. 10 shows a diagram that illustrates the dependence of the uniformity error of the image height of the REMA objective in accordance with FIG. 5, for various settings.

FIG. 8 shows that pupil function which is to be set in the field plane 503 (reticle plane). The telecentric angle [mrad] is illustrated to this end as a function of the image height r[mm]. FIG. 9 shows the dependence of the telecentric error [mrad] on the image height y. It may be seen that the maximum telecentric error is <0.2 mrad for an annular setting of <0.3 mrad. It is to be seen from FIG. 10 that the maximum uniformity error plotted on the ordinate is <0.05%, a field profile of up to 100.5% being set in order to maintain the transmission or the layer influences. The planar-concave negative lens 516 serves as manipulator for compensating uniformity errors with a linear field profile.

The biasphere 517 enables a large variation in the radial refractive power profile in the case of moderate deformation of the individual surfaces inside a very short installation space that is determined by the axial thickness of the biasphere. If such a biasphere is positioned in the immediate vicinity of the image field, it is possible to correct large telecentric errors, or to set any desired pupil functions within wide limits. Despite the strong aspheric action, the biasphere is relatively unproblematic with regard to the fabrication of its surfaces and to the testing of the surfaces, since only relatively slight surface deformations occur. In addition, testing can be carried out using one and the same test optics owing to the symmetry of the two aspheric surfaces, and this substantially eases the outlay on testing.

Figure 11:
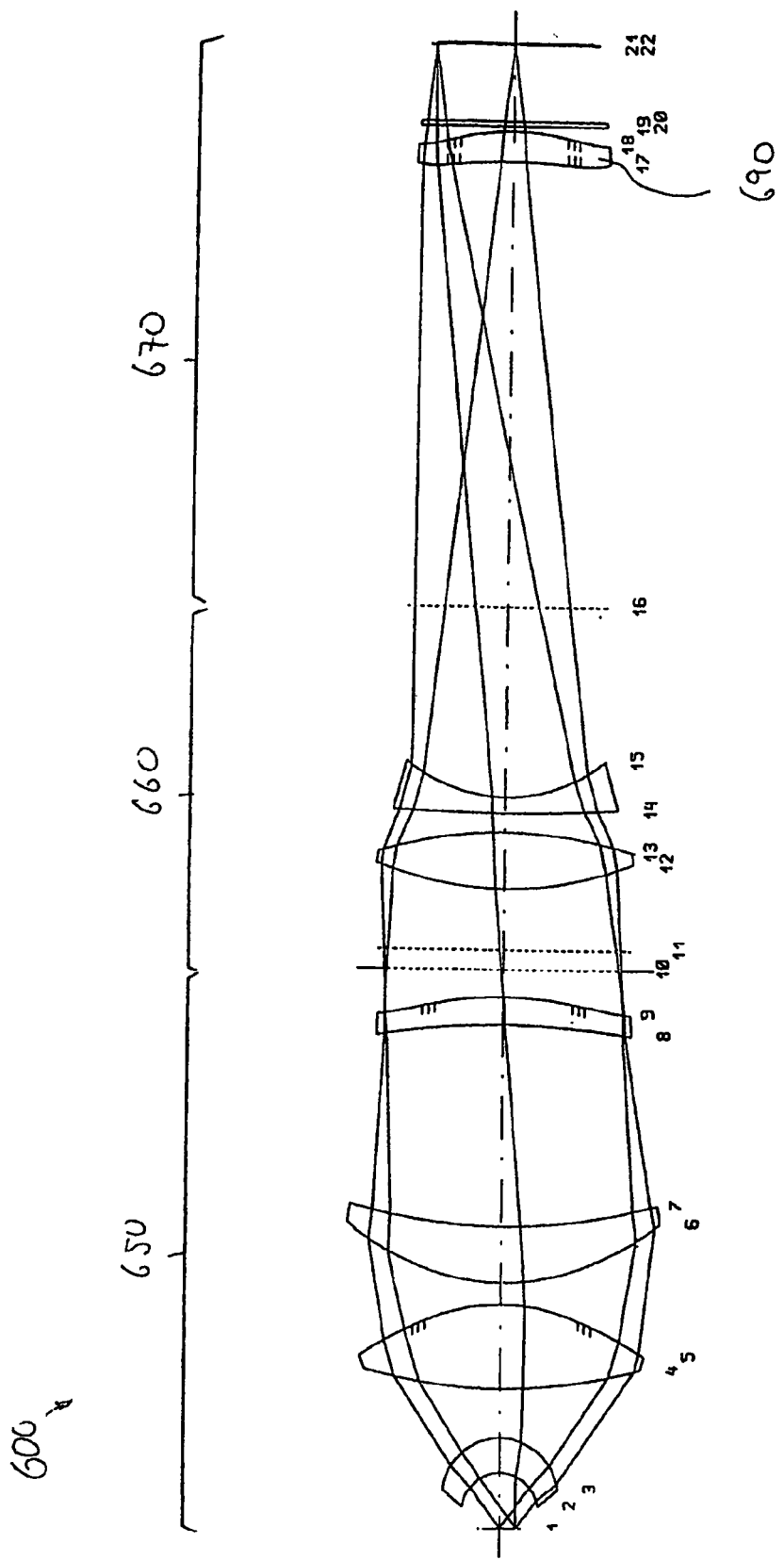
FIG. 11 shows a second embodiment of an inventive imaging system configured as a REMA objective.

FIG. 11 shows another variant of an inventive lithography objective 600 that is designed as REMA objective for 248 nm. The exit-side biasphere 690 is shaped here as a positive meniscus lens with a concave surface on the object side in conjunction with basically the same division into a condenser part 650, an intermediate part 660 and a field lens part 670.

The system has an enlarging linear magnification β=−4.73. The object field diameter is 27 mm. The object-side numerical aperture is 0.127. The design length is 1200 mm. An edge sharpness of 0.1-99.9%—exactly 0.253 mm is achieved. The pupil function (desired value and actual value) is specified in Table 9, while the specification comes from Tables 10 and 11.

Figure 12:
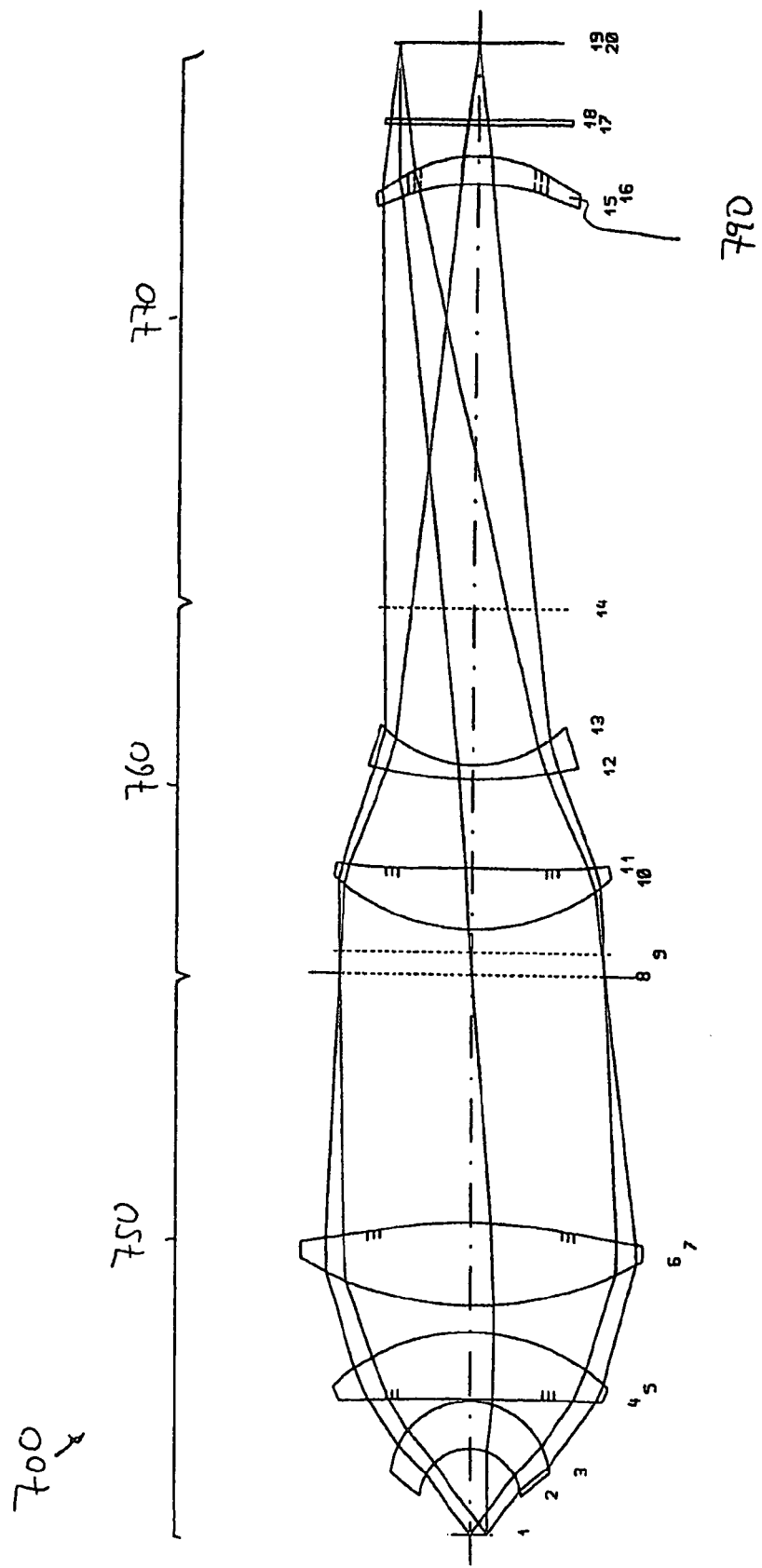
FIG. 12 shows a third embodiment of an inventive imaging system configured as a REMA objective.

Another variant of an inventive lithography objective 700, which is designed as a REMA objective for 248 nm, is shown in FIG. 12. Here, in conjunction with basically the same division into a condenser part 750, an intermediate part 760 and a field lens part 770, the exit-side biasphere 790 is shaped as a positive meniscus lens with a concave surface on the object side and a relatively strong curvature.

The system has an enlarging linear magnification β=−=4.73. The object field diameter is 27 mm. The object-side numerical aperture is 0.127. The design length is 1200 mm. An edge sharpness of 0.1-99.9%—exactly 0.251 mm is achieved. The pupil function (desired value and actual value) is specified in Table 12, while the specification comes from Tables 13 and 14.

Figure 13:
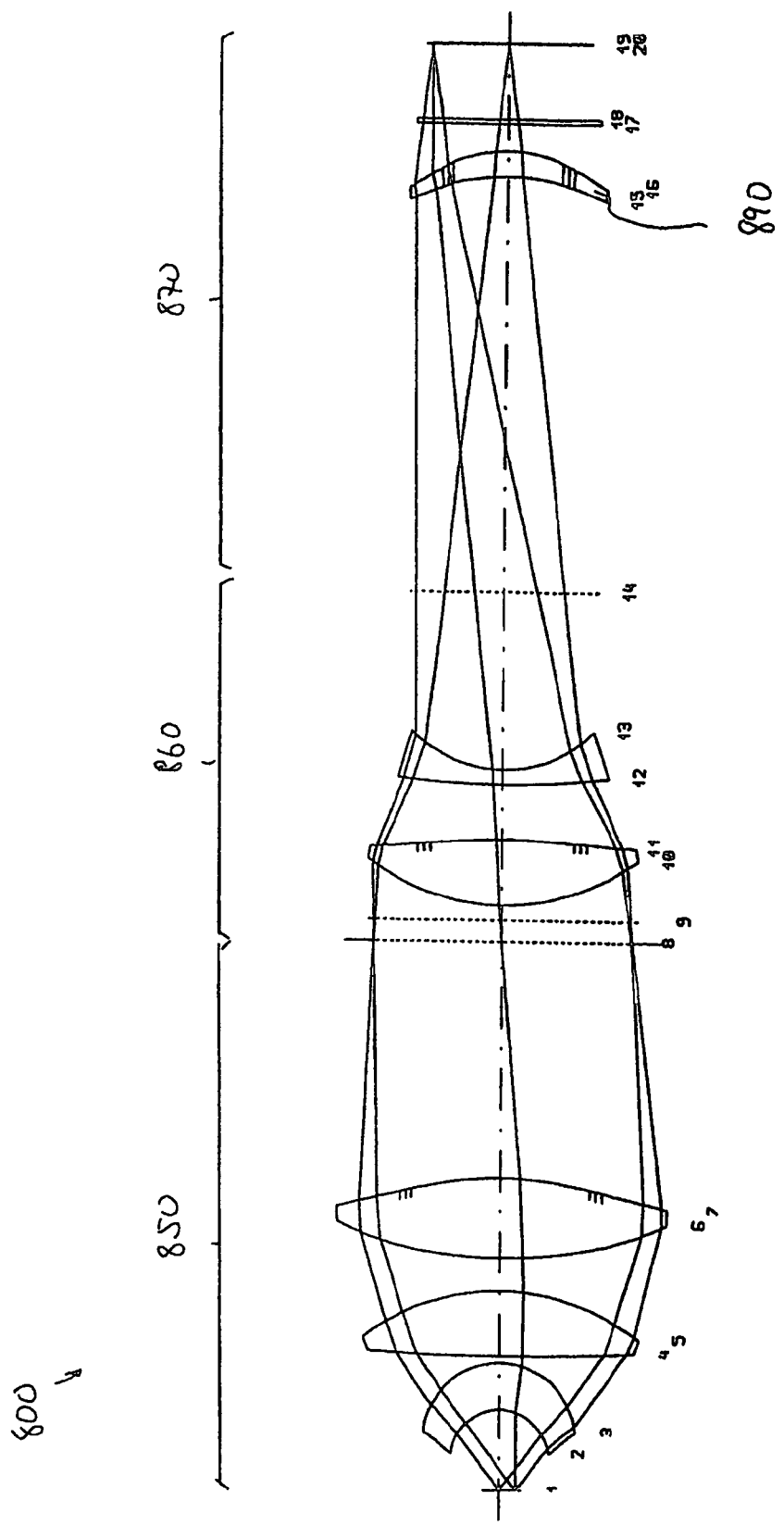
FIG. 13 shows a fourth embodiment of an inventive imaging system configured as a REMA objective.

Another variant of an inventive lithography objective 800, which is designed as a REMA objective for 248 nm, is shown in FIG. 13. Here, in conjunction with basically the same division into a condenser part 850, an intermediate part 860 and a field lens part 870, the exit-side biasphere 890 is shaped as a positive meniscus lens with a concave surface on the object side.

The system has an enlarging linear magnification β=−4.73. The object field diameter is 27 mm. The object-side numerical aperture is 0.127. The design length is 1200 mm. An edge sharpness of 0.1-99.9%—exactly 0.244 mm is achieved. The pupil function (desired value and actual value) is specified in Table 15, while the specification comes from Tables 16 and 17.

The examples so far show possibilities for using a plurality of aspheric surfaces in the case of lithography objectives without coming up against technological limits in fabrication and testing because of strong deformations of the aspheres. Further measures for avoiding such problems are proposed in conjunction with FIGS. 14 to 16. As mentioned at the beginning, in optical design a customary approach to reducing aspheric deformation is to introduce further aspheres at a point with strongly deformed aspheres in order to distribute the strong deformation over a number of more weakly deformed aspheres. The inventors have now found out that great technological advantages can be yielded in the case of this procedure when, instead of one strongly deformed aspheric surface, use is made of two or more identically or at least similarly aspherized surfaces with a correspondingly weaker deformation. It is true that a division into two or more identical or similar aspheric surfaces slightly increases the outlay on fabrication, since a number of surfaces need to processed. However, the surface processing of all the identical aspheres can substantially proceed in accordance with the same program. In particular, identical and similar aspheric surfaces can be tested with the same test optics such that a substantial outlay on testing can be saved.

Figure 14:
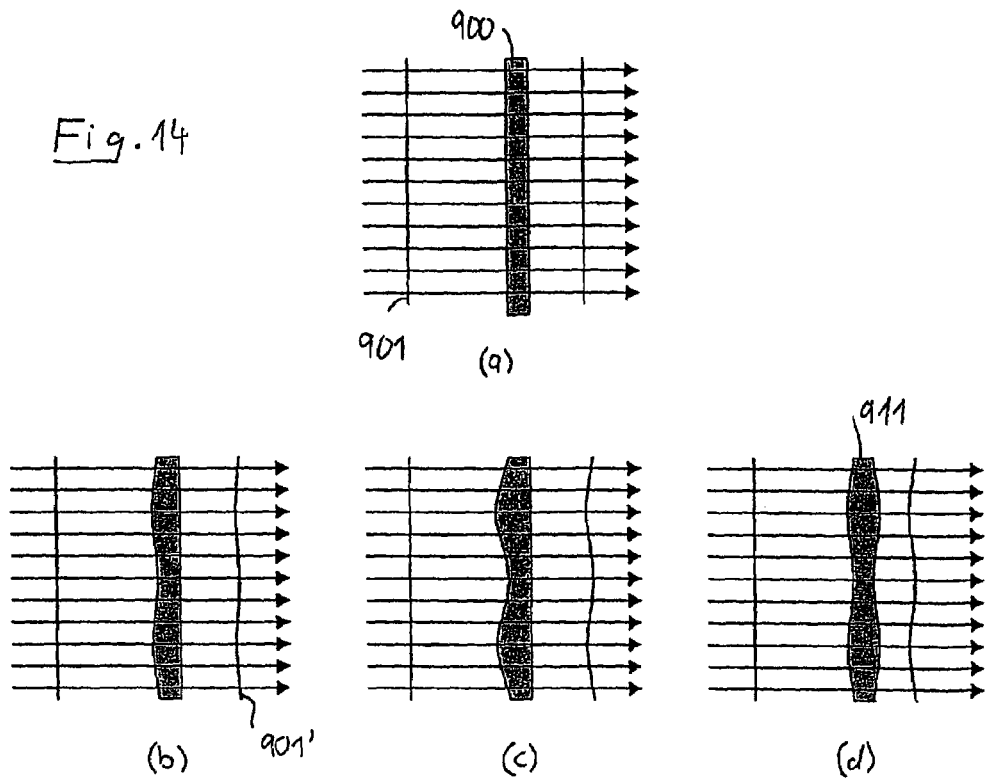

This basic idea will be explained in more detail with the aid of FIG. 14. FIG. 14(a) shows a plane-parallel plate 900 that is transirradiated by a plane wave. It is to be seen with the aid of the schematically depicted wavefront 901 that the plane wave upstream of the plane-parallel plate and downstream of the plane-parallel plate has no aberrations and that therefore a plane wave remains. If, according to FIG. 14(b), one side of the plane-parallel plate is now deformed with a deformation d (x, y), the continuous wavefront acquires a wave aberration such that a slightly deformed wave 901' results. The wave aberration can be described substantially in the zero order immediately downstream of the "thin" plate by the product (n−11)*d(x, y), n being the refractive index of the plate. If, in accordance with FIG. 14(c) the asphericity is doubled starting from FIG. 14(b), there is also a doubling of the wave deformation.

However, if, in turn, starting from the situation in FIG. 14(b), an identical aspheric surface is once again also applied to the exit side of the plane-parallel plate, it is possible as a result for the wave aberration likewise to rise to 2*(n−1)*d(x, y) (FIG. 14(d)). The effects of the entrance-side aspheric surface and the exit-side aspheric surface of the double aspheric lens 911 formed thereby are added together so that the effect seems to gradually form an asphere with a deformation of 2*d(x, y). It is therefore conceivable in principle to distribute an asphere with the deformation 2*d(x,y) over two aspheres each having identical deformations of d(x,y).

It is likewise possible in an optical imaging system, for example a projection objective for microlithography, to distribute an asphere with a large deformation over two aspheres with a lesser, but the same or similar deformation, or to relieve an asphere with deformation that is threatening to become greater than a permissible limit value by a second, identical or similar asphere. This can be carried out such that the entire deformation corresponds substantially to the sum of the two deformations so that it is possible to reach apparently larger, effective deformations.

If the surface curvatures of the mutually supplementary aspheric surfaces are in agreement completely or at least predominantly, an identical test optics can be used for testing the additional aspheric surface. As a result, no extra outlay is generated in the case of testing, it merely being necessary to increase the number of the surfaces to be aspherized.

Starting from this basic principle, it will be necessary in a real design to support the result of the method by subsequent optimization in order to take account of a finite spacing between the two resulting aspheres.

It is, in addition, not mandatory for the mutually corresponding, identical or similar aspheric surfaces to be directly adjacent. It is also possible for at least one optical surface, for example a spherical lens surface to be situated between the mutually corresponding aspheric surfaces.

In a further development of the method, it is not necessary in principle for the mutually corresponding aspheric surfaces to be exactly identical. It has emerged that it is also possible for the mutually supplementary or corresponding aspheric surfaces to be shaped "similarly" in such a way that they can be tested with the same test optics (given a different working distance or testing distance). The substantial technological advantages further ensue for testing in this case, as well.

It is provided in one variant of the method to produce a desired aspheric action in which provision is made of at least two aspheric surfaces that substantially emerge from one another or are transformed into one another by means of an orthotomic projection. This means that the surface normals to the aspheric surfaces that are similar in this sense form a "substantially orthotomic system". It is possible in this way even to test aspheres having different absolute dimensions with the aid of an identical test optics, since it is possible in the case of all the aspheric surfaces belonging to an orthotomic system of the testing radiation provided by the test optics to impinge perpendicularly on these aspheric surfaces, thus facilitating testing.

Two or more aspheric surfaces to be compared need not form a perfect orthotomic system. It suffices when they form a "substantially orthotomic system" in the sense explained below: assuming that two aspheric surfaces to be compared are firstly arranged concentrically about a point with reference to the apex radius, a surface normal to the first surface then encloses an angle α at the respective intersection point with the surface normal to the second surface. It holds for an exactly orthotomic system that α=0 for all possible surface normals. It holds for a "substantially orthotomic system" in the sense of the application that $$\sin(\alpha) \leq \frac{N}{(D/\lambda)}$$

D being the optically free diameter of the aspheric surface, and λ the wavelength (for example 633 nm) used for testing. The apex spacing of the two surfaces now need no longer be given by the difference between the apex radii, but is to be selected so as to minimize the maximum angle α that occurs. In the sense of the application, "substantially orthotomic systems" are involved, in particular, whenever it holds that N=50, in particular N=10 or N=2. This means that the residual compensation of 50 or 10 or 2 interference fringes/diameters then occurs in an interferogram in the case of interferometric measurement.

Figures 15, 16:
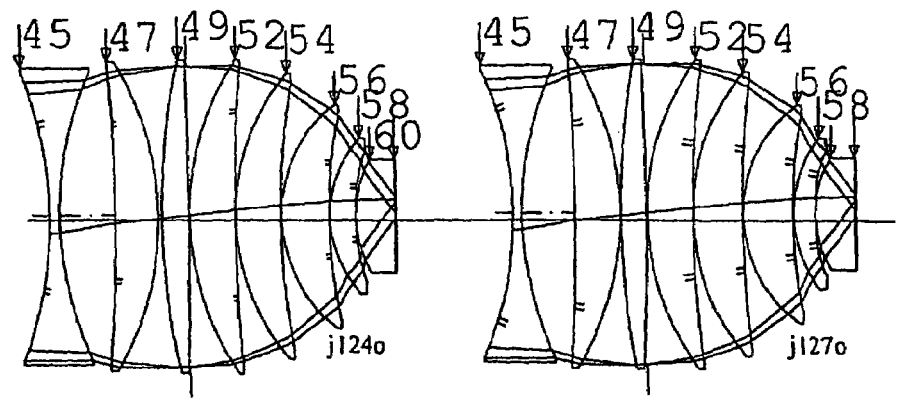
FIG. 15 shows a lens section through the image-side end region of a catadioptric immersion projection objective.
FIG. 16 shows a variant of the projection objective shown in FIG. 15, with aspheric lens surfaces similar to one another.

FIG. 15 shows an image-side end region of a catadioptric immersion projection objective 1000, designed for 193 nm, as an example of the advantages of this design method. In a region close to the stop between the 1005 and image plane 1003 a relatively strongly deformed aspheric surface (surface 53) is positioned on the exit side of an approximately planar-convex positive meniscus (maximum deformation approximately 400 μm). In the corresponding system in FIG. 16, the strongly deformed aspheric surface was relieved by positioning on the exit surface, likewise concave relative to the image plane, of the positive meniscus lens following thereupon, a further aspheric surface (surface 55) that has substantially the same surface description as that of the aspheric surface upstream thereof. It was possible to halve the maximum deformation from approximately 400 μm to circa 200 μm by means of this measure, thus simplifying fabrication and testing. Moreover, it was even possible to substantially improve the system performance from 12.0 mλ to 10.6 mλ. It is assumed that the improvement to the system performance results in part from the fact that higher-order deformations at the aspheric surfaces can be reproduced when asphericity is distributed over more than one surface. The specification of the systems is quoted in Tables 18 and 19 (re FIG. 10) and 20 and 21 (re FIG. 11).

TABLE 1 r217v

| SURFACE | RADII | THICKNESSES | LENSES | REFRACTIVE INDEX 193.368 nm | ½ FREE DIAMETER |
|---|---|---|---|---|---|
| 0 | 0.000000000 | 32.320000000 | LUFTV193 | 1.00030168 | 56.080 |
| 1 | 0.000000000 | 0.000000000 | LUFTV193 | 1.00030168 | 63.974 |
| 2 | −1459.164104982AS | 10.883642136 | SIO2V | 1.56078570 | 63.974 |
| 3 | 180.619581350AS | 39.156911315 | N2VP950 | 1.00029966 | 67.044 |
| 4 | −107.911220584 | 84.781901584 | SIO2V | 1.56078570 | 68.729 |
| 5 | −213.989607599 | 1.000000000 | N2VP950 | 1.00029966 | 111.823 |
| 6 | −412.845153739AS | 45.792045149 | SIO2V | 1.56078570 | 120.332 |
| 7 | −190.379523326 | 1.000000000 | N2VP950 | 1.00029966 | 126.132 |
| 8 | −4614.877843160 | 27.708693812 | SIO2V | 1.56078570 | 134.795 |
| 9 | −457.274001084 | 1.000000000 | N2VP950 | 1.00029966 | 135.949 |
| 10 | 420.000000000 | 30.000000000 | SIO2V | 1.56078570 | 137.193 |
| 11 | 35602.890285272AS | 1.000000000 | N2VP950 | 1.00029966 | 136.246 |
| 12 | 270.000000000 | 26.475451634 | SIO2V | 1.56078570 | 131.917 |
| 13 | 502.754294891 | 1.000000000 | N2VP950 | 1.00029966 | 129.430 |
| 14 | 173.244893529 | 85.000000000 | SIO2V | 1.56078570 | 120.248 |
| 15 | 214.130898591AS | 20.540800473 | N2VP950 | 1.00029966 | 92.443 |
| 16 | 1272.514093441 | 39.820596617 | SIO2V | 1.56078570 | 90.281 |
| 17 | 110.781466896 | 74.295506424 | N2VP950 | 1.00029966 | 68.947 |
| 18 | −104.989672476 | 9.000000000 | SIO2V | 1.56078570 | 65.198 |
| 19 | 730.287776054AS | 22.486936747 | N2VP950 | 1.00029966 | 71.895 |
| 20 | −307.597097235 | 9.262679110 | SIO2V | 1.56078570 | 75.360 |

TABLE 1-continued r217v

| SURFACE | RADII | THICKNESSES | LENSES | REFRACTIVE INDEX 193.368 nm | ½ FREE DIAMETER |
|---|---|---|---|---|---|
| 21 | 451.935383561 | 17.226875006 | N2VP950 | 1.00029966 | 83.667 |
| 22 | −1494.299186899AS | 38.937578772 | SIO2V | 1.56078570 | 87.442 |
| 23 | −148.722559000 | 1.035639602 | N2VP950 | 1.00029966 | 92.689 |
| 24 | −3752.461411339 | 9.000000000 | SIO2V | 1.56078570 | 103.329 |
| 25 | 258.882844388 | 20.496820411 | N2VP950 | 1.00029966 | 111.025 |
| 26 | 784.281838265 | 42.249678112 | SIO2V | 1.56078570 | 115.317 |
| 27 | −299.834096576 | 1.000000000 | N2VP950 | 1.00029966 | 119.214 |
| 28 | 252.743271757 | 38.035650313 | SIO2V | 1.56078570 | 152.454 |
| 29 | 462.923229099AS | 46.891093164 | N2VP950 | 1.00029966 | 151.679 |
| 30 | 0.000000000 | −33.756526966 | N2VP950 | 1.00029966 | 154.358 |
| 31 | 330.495802864 | 9.500000000 | SIO2V | 1.56078570 | 155.347 |
| 32 | 231.289261882 | 40.469468987 | N2VP950 | 1.00029966 | 153.254 |
| 33 | 571.711143658 | 76.794483240 | SIO2V | 1.56078570 | 155.511 |
| 34 | −290.609715959 | 1.000000000 | N2VP950 | 1.00029966 | 157.318 |
| 35 | 237.617551020 | 57.120134799 | SIO2V | 1.56078570 | 153.853 |
| 36 | 1696.873918301AS | 1.000000000 | N2VP950 | 1.00029966 | 151.130 |
| 37 | 157.356137136 | 46.718690084 | SIO2V | 1.56078570 | 127.954 |
| 38 | 293.488395013AS | 1.000000000 | N2VP950 | 1.00029966 | 121.868 |
| 39 | 151.671762316 | 59.722817409 | SIO2V | 1.56078570 | 107.894 |
| 40 | 208.655839861AS | 4.385810273 | N2VP950 | 1.00029966 | 80.177 |
| 41 | 204.831099129 | 21.287882831 | SIO2V | 1.56078570 | 77.985 |
| 42 | 804.557271249 | 6.470098061 | N2VP950 | 1.00029966 | 70.895 |
| 43 | 475.191683660 | 12.337210713 | SIO2V | 1.56078570 | 57.127 |
| 44 | 1142.238156752 | 5.049134278 | N2VP950 | 1.00029966 | 48.974 |
| 45 | 0.000000000 | 9.468750000 | SIO2V | 1.56078570 | 36.676 |
| 46 | 0.000000000 | 5.000014319 | LUFTV193 | 1.00030168 | 29.397 |
| 47 | 0.000000000 | −0.000014316 | | 1.00000000 | 14.020 |

TABLE 2

ASPHERIC CONSTANTS

SURFACE NO. 2

| K | 0.0000 |
|---|---|
| C1 | 1.09119463e−007 |
| C2 | −5.30689084e−012 |
| C3 | −1.09315970e−016 |
| C4 | 4.82752139e−020 |
| C5 | −2.47155650e−023 |
| C6 | 1.58501935e−027 |
| C7 | 0.00000000e+000 |
| C8 | 0.00000000e+000 |
| C9 | 0.00000000e+000 |

SURFACE NO. 3

| K | 0.0000 |
|---|---|
| C1 | −1.56384505e−007 |
| C2 | 1.06996314e−011 |
| C3 | −1.05376927e−015 |
| C4 | 1.85697980e−019 |
| C5 | −3.19176766e−023 |
| C6 | 2.00274942e−027 |
| C7 | 0.00000000e+000 |
| C8 | 0.00000000e+000 |
| C9 | 0.00000000e+000 |

SURFACE NO. 6

| K | 0.0000 |
|---|---|
| C1 | 3.83956125e−009 |
| C2 | 3.47868288e−013 |
| C3 | −1.28803865e−017 |
| C4 | 1.18910850e−021 |
| C5 | −4.25647183e−026 |
| C6 | 5.77188832e−031 |
| C7 | 0.00000000e+000 |
| C8 | 0.00000000e+000 |
| C9 | 0.00000000e+000 |

TABLE 2-continued

ASPHERIC CONSTANTS

SURFACE NO. 11

| K | 0.0000 |
|---|---|
| C1 | 4.81120275e−009 |
| C2 | 4.13520576e−014 |
| C3 | −5.36254054e−018 |
| C4 | 3.56325685e−022 |
| C5 | −9.96093521e−027 |
| C6 | 1.64692958e−031 |
| C7 | 0.00000000e+000 |
| C8 | 0.00000000e+000 |
| C9 | 0.00000000e+000 |

SURFACE NO. 15

| K | 0.0000 |
|---|---|
| C1 | −1.61331019e−008 |
| C2 | 3.52919257e−014 |
| C3 | 3.06661268e−017 |
| C4 | −7.22002268e−021 |
| C5 | 4.16057249e−025 |
| C6 | −2.31207963e−029 |
| C7 | 0.00000000e+000 |
| C8 | 0.00000000e+000 |
| C9 | 0.00000000e+000 |

SURFACE NO. 19

| K | 0.0000 |
|---|---|
| C1 | 1.27878859e−008 |
| C2 | −4.13979560e−012 |
| C3 | −4.07208879e−016 |
| C4 | 5.26377145e−020 |
| C5 | −8.68076114e−025 |
| C6 | −6.17849743e−029 |
| C7 | 0.00000000e+000 |
| C8 | 0.00000000e+000 |
| C9 | 0.00000000e+000 |

TABLE 2-continued

ASPHERIC CONSTANTS

SURFACE NO. 22

| | |
|---|---|
| K | 0.0000 |
| C1 | −3.87264754e−008 |
| C2 | 1.81612882e−012 |
| C3 | −1.09323759e−016 |
| C4 | 2.55204344e−021 |
| C5 | −1.38859668e−025 |
| C6 | 4.37920480e−030 |
| C7 | 0.00000000e+000 |
| C8 | 0.00000000e+000 |
| C9 | 0.00000000e+000 |

SURFACE NO. 29

| | |
|---|---|
| K | 0.0000 |
| C1 | 1.55648594e−009 |
| C2 | 7.87201037e−014 |
| C3 | −7.46227893e−019 |
| C4 | −8.47715974e−023 |
| C5 | 3.94573522e−027 |
| C6 | −5.27152158e−032 |
| C7 | 0.00000000e+000 |
| C8 | 0.00000000e+000 |
| C9 | 0.00000000e+000 |

SURFACE NO. 36

| | |
|---|---|
| K | 0.0000 |
| C1 | 1.38463693e−009 |
| C2 | 9.34105890e−014 |
| C3 | −3.31978125e−018 |
| C4 | 1.98461745e−022 |

TABLE 2-continued

ASPHERIC CONSTANTS

| | |
|---|---|
| C5 | −5.31913432e−027 |
| C6 | 7.36614617e−032 |
| C7 | 0.00000000e+000 |
| C8 | 0.00000000e+000 |
| C9 | 0.00000000e+000 |

SURFACE NO. 38

| | |
|---|---|
| K | 0.0000 |
| C1 | 1.23494614e−009 |
| C2 | 4.07836082e−013 |
| C3 | 5.52319264e−018 |
| C4 | −1.06214092e−021 |
| C5 | 5.56801394e−026 |
| C6 | −1.09523279e−030 |
| C7 | 0.00000000e+000 |
| C8 | 0.00000000e+000 |
| C9 | 0.00000000e+000 |

SURFACE NO. 40

| | |
|---|---|
| K | 0.0000 |
| C1 | 1.76315794e−008 |
| C2 | 3.90180649e−012 |
| C3 | 1.77550556e−017 |
| C4 | −3.14301026e−021 |
| C5 | 4.39156108e−025 |
| C6 | 8.08125064e−030 |
| C7 | 0.00000000e+000 |
| C8 | 0.00000000e+000 |
| C9 | 0.00000000e+000 |

TABLE 3 r218v

| SURFACE | RADII | THICKNESSES | LENSES | REFRACTIVE INDEX 193.368 nm | ½ FREE DIAMETER |
|---|---|---|---|---|---|
| 0 | 0.000000000 | 32.000000000 | LUFTV193 | 1.00030168 | 56.080 |
| 1 | 0.000000000 | 0.000000000 | LUFTV193 | 1.00030168 | 63.909 |
| 2 | 0.000000000 | 17.844950703 | SIO2V | 1.56078570 | 63.909 |
| 3 | 141.364869321AS | 42.976532865 | N2VP950 | 1.00029966 | 68.570 |
| 4 | −106.379969384 | 78.027724995 | SIO2V | 1.56078570 | 70.336 |
| 5 | −166.687860454 | 1.000000000 | N2VP950 | 1.00029966 | 108.096 |
| 6 | −453.543565041AS | 26.035967427 | SIO2V | 1.56078570 | 118.587 |
| 7 | −232.687652830 | 1.000000000 | N2VP950 | 1.00029966 | 122.253 |
| 8 | −4175.612871634 | 34.571195540 | SIO2V | 1.56078570 | 132.347 |
| 9 | −339.014596070 | 1.000000000 | N2VP950 | 1.00029966 | 134.146 |
| 10 | 500.000000000 | 34.007738554 | SIO2V | 1.56078570 | 137.817 |
| 11 | −1979.358317517AS | 1.000000000 | N2VP950 | 1.00029966 | 137.328 |
| 12 | 275.000000000 | 38.615595029 | SIO2V | 1.56078570 | 131.717 |
| 13 | 713.420881508 | 1.000000000 | N2VP950 | 1.00029966 | 127.146 |
| 14 | 219.840025272 | 85.000000000 | SIO2V | 1.56078570 | 118.935 |
| 15 | 321.375540921AS | 4.922289739 | N2VP950 | 1.00029966 | 92.215 |
| 16 | 408.796272617 | 25.823140797 | SIO2V | 1.56078570 | 89.829 |
| 17 | 101.545676471 | 72.090709976 | N2VP950 | 1.00029966 | 70.185 |
| 18 | −113.185080136 | 9.000000000 | SIO2V | 1.56078570 | 65.216 |
| 19 | −6276.526315852AS | 30.855400278 | N2VP950 | 1.00029966 | 68.772 |
| 20 | −137.418484927 | 17.333137381 | SIO2V | 1.56078570 | 70.621 |
| 21 | 413.789552546 | 20.404389259 | N2VP950 | 1.00029966 | 84.304 |
| 22 | −625.367774639AS | 35.350033804 | SIO2V | 1.56078570 | 87.244 |
| 23 | −140.888106901 | 1.000000000 | N2VP950 | 1.00029966 | 91.874 |
| 24 | 2331.984028426 | 9.000000000 | SIO2V | 1.56078570 | 105.044 |
| 25 | 250.875405170 | 22.125324131 | N2VP950 | 1.00029966 | 111.593 |
| 26 | 835.343130512 | 39.746104742 | SIO2V | 1.56078570 | 115.758 |
| 27 | −326.784324219 | 1.000000000 | N2VP950 | 1.00029966 | 119.638 |
| 28 | 255.433855640 | 46.317736953 | SIO2V | 1.56078570 | 153.611 |
| 29 | 490.028436327AS | 42.760537386 | N2VP950 | 1.00029966 | 152.582 |
| 30 | 0.000000000 | −32.760537386 | N2VP950 | 1.00029966 | 154.980 |
| 31 | 341.273585728 | 9.000000000 | SIO2V | 1.56078570 | 156.026 |
| 32 | 236.023249432 | 38.136711957 | N2VP950 | 1.00029966 | 154.319 |
| 33 | 538.352989022 | 76.926527135 | SIO2V | 1.56078570 | 156.695 |

TABLE 3-continued r218v

| SURFACE | RADII | THICKNESSES | LENSES | REFRACTIVE INDEX 193.368 nm | ½ FREE DIAMETER |
|---|---|---|---|---|---|
| 34 | −303.854952853 | 1.000000000 | N2VP950 | 1.00029966 | 158.497 |
| 35 | 242.471332890 | 55.345758805 | SIO2V | 1.56078570 | 156.649 |
| 36 | 1273.475455674AS | 1.000000000 | N2VP950 | 1.00029966 | 154.009 |
| 37 | 165.078804777 | 51.848716746 | SIO2V | 1.56078570 | 133.227 |
| 38 | 360.689088970AS | 2.381005965 | N2VP950 | 1.00029966 | 127.273 |
| 39 | 155.800125543 | 60.708631213 | SIO2V | 1.56078570 | 109.767 |
| 40 | 257.289833789AS | 3.059278416 | N2VP950 | 1.00029966 | 83.432 |
| 41 | 214.574391728 | 23.013966672 | SIO2V | 1.56078570 | 79.983 |
| 42 | 581.722478991 | 7.376730203 | N2VP950 | 1.00029966 | 70.287 |
| 43 | 432.957343908 | 11.524326583 | SIO2V | 1.56078570 | 56.460 |
| 44 | 953.963555708 | 5.255374130 | N2VP950 | 1.00029966 | 48.919 |
| 45 | 0.000000000 | 9.375000000 | SIO2V | 1.56078570 | 36.611 |
| 46 | 0.000000000 | 5.000014179 | LUFTV193 | 1.00030168 | 29.403 |
| 47 | 0.000000000 | 0.000014174 | | 1.00000000 | 14.020 |

TABLE 4

ASPHERIC CONSTANTS

SURFACE NO. 3

| | |
|---|---|
| K | 0.0000 |
| C1 | −2.86481339e−007 |
| C2 | 1.33428721e−011 |
| C3 | −1.15140908e−015 |
| C4 | 9.48184306e−020 |
| C5 | −5.08944755e−024 |
| C6 | 1.72476575e−028 |
| C7 | 0.00000000e+000 |
| C8 | 0.00000000e+000 |
| C9 | 0.00000000e+000 |

SURFACE NO. 6

| | |
|---|---|
| K | 0.0000 |
| C1 | −1.00040949e−008 |
| C2 | 1.91234847e−014 |
| C3 | −3.08640325e−018 |
| C4 | 2.26769898e−022 |
| C5 | −1.40237554e−027 |
| C6 | 3.92572161e−031 |
| C7 | 0.00000000e+000 |
| C8 | 0.00000000e+000 |
| C9 | 0.00000000e+000 |

SURFACE NO. 11

| | |
|---|---|
| K | 0.0000 |
| C1 | −1.62545449e−009 |
| C2 | −8.02017004e−014 |
| C3 | 9.07741798e−019 |
| C4 | 6.22361354e−023 |
| C5 | 7.91274435e−029 |
| C6 | −2.44533345e−032 |
| C7 | 0.00000000e+000 |
| C8 | 0.00000000e+000 |
| C9 | 0.00000000e+000 |

SURFACE NO. 15

| | |
|---|---|
| K | 0.0000 |
| C1 | −5.34383332e−008 |
| C2 | 2.24730624e−012 |
| C3 | 2.71223685e−018 |
| C4 | −5.23845943e−021 |
| C5 | 1.96396121e−025 |
| C6 | −1.58673005e−030 |
| C7 | 0.00000000e+000 |
| C8 | 0.00000000e+000 |
| C9 | 0.00000000e+000 |

TABLE 4-continued

ASPHERIC CONSTANTS

SURFACE NO. 19

| | |
|---|---|
| K | 0.0000 |
| C1 | 1.79672442e−009 |
| C2 | −6.77223099e−012 |
| C3 | −3.96951402e−016 |
| C4 | 2.97275706e−020 |
| C5 | 1.64172060e−024 |
| C6 | −2.76013991e−028 |
| C7 | 0.00000000e+000 |
| C8 | 0.00000000e+000 |
| C9 | 0.00000000e+000 |

SURFACE NO. 22

| | |
|---|---|
| K | 0.0000 |
| C1 | −3.46618935e−008 |
| C2 | 1.24390269e−012 |
| C3 | −4.83656616e−017 |
| C4 | 1.75302648e−022 |
| C5 | 1.21150441e−025 |
| C6 | −1.12186612e−029 |
| C7 | 0.00000000e+000 |
| C8 | 0.00000000e+000 |
| C9 | 0.00000000e+000 |

SURFACE NO. 29

| | |
|---|---|
| K | 0.0000 |
| C1 | 2.91242380e−009 |
| C2 | 5.36672462e−014 |
| C3 | −3.84138467e−019 |
| C4 | −5.83775573e−023 |
| C5 | 3.05838142e−027 |
| C6 | −4.39732968e−032 |
| C7 | 0.00000000e+000 |
| C8 | 0.00000000e+000 |
| C9 | 0.00000000e+000 |

SURFACE NO. 36

| | |
|---|---|
| K | 0.0000 |
| C1 | 1.34059170e−009 |
| C2 | 1.06725317e−013 |
| C3 | −3.54947088e−018 |
| C4 | 1.30852468e−022 |
| C5 | −2.68379318e−027 |
| C6 | 3.47219208e−032 |
| C7 | 0.00000000e+000 |
| C8 | 0.00000000e+000 |
| C9 | 0.00000000e+000 |

TABLE 4-continued

ASPHERIC CONSTANTS

SURFACE NO. 38

| | |
|---|---|
| K | 0.0000 |
| C1 | 2.63154343e−009 |
| C2 | 2.84724714e−013 |
| C3 | 1.03599926e−018 |
| C4 | −5.71879023e−022 |
| C5 | 3.15244493e−026 |
| C6 | −4.20712791e−031 |
| C7 | 0.00000000e+000 |
| C8 | 0.00000000e+000 |
| C9 | 0.00000000e+000 |

TABLE 4-continued

ASPHERIC CONSTANTS

SURFACE NO. 40

| | |
|---|---|
| K | 0.0000 |
| C1 | 9.80415755e−009 |
| C2 | 4.75026576e−012 |
| C3 | −1.99060433e−016 |
| C4 | 9.51377978e−021 |
| C5 | −4.27716194e−025 |
| C6 | −5.70277764e−030 |
| C7 | 0.00000000e+000 |
| C8 | 0.00000000e+000 |
| C9 | 0.00000000e+000 |

TABLE 5 r221v

| SURFACE | RADII | THICKNESSES | LENSES | REFRACTIVE INDEX 193.368 nm | ½ FREE DIAMETER |
|---|---|---|---|---|---|
| 0 | 0.000000000 | 32.320000000 | LUFTV193 | 1.00030168 | 56.080 |
| 1 | 0.000000000 | 0.000000000 | LUFTV193 | 1.00030168 | 63.987 |
| 2 | −1414.283119543AS | 8.000000000 | SIO2V | 1.56078570 | 64.113 |
| 3 | 424.792851760 | 5.648215816 | N2VP950 | 1.00029966 | 65.856 |
| 4 | 1299.539331232AS | 8.000000000 | SIO2V | 1.56078570 | 67.145 |
| 5 | 235.797454960 | 42.846403790 | N2VP950 | 1.00029966 | 69.121 |
| 6 | −102.370191138 | 69.189096195 | SIO2V | 1.56078570 | 70.860 |
| 7 | −172.393415521 | 1.000000000 | N2VP950 | 1.00029966 | 107.074 |
| 8 | −311.506629059AS | 37.876409079 | SIO2V | 1.56078570 | 116.081 |
| 9 | −198.729331749 | 1.000000000 | N2VP950 | 1.00029966 | 122.907 |
| 10 | 10618.353983725 | 37.816832272 | SIO2V | 1.56078570 | 134.690 |
| 11 | −345.414077618 | 1.000000000 | N2VP950 | 1.00029966 | 136.145 |
| 12 | 400.000000000 | 25.074567519 | SIO2V | 1.56078570 | 137.066 |
| 13 | 1543.425862196AS | 1.000000000 | N2VP950 | 1.00029966 | 136.002 |
| 14 | 250.000000000 | 44.417771731 | SIO2V | 1.56078570 | 132.858 |
| 15 | 424.538863322 | 1.000000000 | N2VP950 | 1.00029966 | 125.810 |
| 16 | 174.877745836 | 70.000000000 | SIO2V | 1.56078570 | 118.444 |
| 17 | 243.447507091AS | 14.188161571 | N2VP950 | 1.00029966 | 98.000 |
| 18 | 484.930164939 | 48.000000000 | SIO2V | 1.56078570 | 95.965 |
| 19 | 111.938442661 | 77.053811810 | N2VP950 | 1.00029966 | 71.061 |
| 20 | −109.460895056 | 9.000000000 | SIO2V | 1.56078570 | 65.591 |
| 21 | 438.039183085AS | 23.422549148 | N2VP950 | 1.00029966 | 71.158 |
| 22 | −202.054583818 | 9.000000000 | SIO2V | 1.56078570 | 72.631 |
| 23 | 465.572943863 | 16.082181763 | N2VP950 | 1.00029966 | 82.930 |
| 24 | −1172.049223927AS | 36.326480405 | SIO2V | 1.56078570 | 86.214 |
| 25 | −145.267929878 | 1.000000000 | N2VP950 | 1.00029966 | 90.911 |
| 26 | 1353.417341936 | 9.000000000 | SIO2V | 1.56078570 | 105.237 |
| 27 | 254.308618512 | 21.441664729 | N2VP950 | 1.00029966 | 111.540 |
| 28 | 808.549194446 | 40.139409419 | SIO2V | 1.56078570 | 115.722 |
| 29 | −324.795643495 | 1.000000000 | N2VP950 | 1.00029966 | 119.584 |
| 30 | 259.623325413 | 30.156883912 | SIO2V | 1.56078570 | 152.402 |
| 31 | 442.106202542AS | 49.702134449 | N2VP950 | 1.00029966 | 152.056 |
| 32 | 0.000000000 | −35.918141056 | N2VP950 | 1.00029966 | 155.705 |
| 33 | 321.189339694 | 13.200000000 | SIO2V | 1.56078570 | 156.875 |
| 34 | 235.938498925 | 38.959238636 | N2VP950 | 1.00029966 | 154.952 |
| 35 | 548.092450535 | 78.619078346 | SIO2V | 1.56078570 | 157.303 |
| 36 | −295.129602720 | 1.000000000 | N2VP950 | 1.00029966 | 159.105 |
| 37 | 257.343015350 | 56.517809884 | SIO2V | 1.56078570 | 155.780 |
| 38 | 3502.742343640AS | 1.000000000 | N2VP950 | 1.00029966 | 153.286 |
| 39 | 153.633385258 | 50.277016535 | SIO2V | 1.56078570 | 128.279 |
| 40 | 298.509028204AS | 1.000000000 | N2VP950 | 1.00029966 | 122.045 |
| 41 | 149.675345185 | 60.980134477 | SIO2V | 1.56078570 | 107.243 |
| 42 | 190.178192400AS | 5.453949973 | N2VP950 | 1.00029966 | 77.382 |
| 43 | 197.572510486 | 20.628074249 | SIO2V | 1.56078570 | 75.169 |
| 44 | 718.043747110 | 5.783836616 | N2VP950 | 1.00029966 | 68.036 |
| 45 | 479.704970402 | 11.372838185 | SIO2V | 1.56078570 | 56.262 |
| 46 | 1276.727595948 | 4.938062857 | N2VP950 | 1.00029966 | 48.931 |
| 47 | 0.000000000 | 9.468750000 | SIO2V | 1.56078570 | 36.649 |
| 48 | 0.000000000 | 5.000014315 | LUFTV193 | 1.00030168 | 29.372 |
| 49 | 0.000000000 | −0.000014316 | | 1.00000000 | 14.020 |

TABLE 6

ASPHERIC CONSTANTS

SURFACE NO. 2

| | |
|---|---|
| K | 0.0000 |
| C1 | 2.08525794e-007 |
| C2 | -3.19987515e-011 |
| C3 | 3.56280613e-015 |
| C4 | -3.77486884e-019 |
| C5 | 2.10578968e-023 |
| C6 | -2.70937745e-028 |
| C7 | 0.00000000e+000 |
| C8 | 0.00000000e+000 |
| C9 | 0.00000000e+000 |

SURFACE NO. 4

| | |
|---|---|
| K | 0.0000 |
| C1 | 3.64477027e-008 |
| C2 | 2.00816645e-011 |
| C3 | -2.98745270e-015 |
| C4 | 2.91202348e-019 |
| C5 | -1.79522903e-023 |
| C6 | 3.55575104e-028 |
| C7 | 0.00000000e+000 |
| C8 | 0.00000000e+000 |
| C9 | 0.00000000e+000 |

SURFACE NO. 8

| | |
|---|---|
| K | 0.0000 |
| C1 | 8.55962248e-009 |
| C2 | 2.04733903e-013 |
| C3 | -6.43943314e-018 |
| C4 | 5.73836441e-022 |
| C5 | -1.59385846e-026 |
| C6 | 4.68346251e-031 |
| C7 | 0.00000000e+000 |
| C8 | 0.00000000e+000 |
| C9 | 0.00000000e+000 |

SURFACE NO. 13

| | |
|---|---|
| K | 0.0000 |
| C1 | 7.03699560e-009 |
| C2 | -1.52661867e-014 |
| C3 | -3.99418159e-018 |
| C4 | 1.88604871e-022 |
| C5 | -4.98713537e-027 |
| C6 | 1.16946921e-031 |
| C7 | 0.00000000e+000 |
| C8 | 0.00000000e+000 |
| C9 | 0.00000000e+000 |

SURFACE NO. 17

| | |
|---|---|
| K | 0.0000 |
| C1 | -9.76738019e-009 |
| C2 | 1.42039979e-013 |
| C3 | 2.09426135e-017 |
| C4 | -3.11005072e-021 |
| C5 | 1.30236376e-025 |
| C6 | -9.13097296e-030 |
| C7 | 0.00000000e+000 |
| C8 | 0.00000000e+000 |
| C9 | 0.00000000e+000 |

SURFACE NO. 21

| | |
|---|---|
| K | 0.0000 |
| C1 | 1.14826642e-008 |
| C2 | -5.23285076e-012 |
| C3 | -3.60906300e-016 |
| C4 | 4.17780521e-020 |
| C5 | 4.11241516e-025 |
| C6 | -1.26961570e-028 |
| C7 | 0.00000000e+000 |
| C8 | 0.00000000e+000 |
| C9 | 0.00000000e+000 |

SURFACE NO. 24

| | |
|---|---|
| K | 0.0000 |
| C1 | -3.11670458e-008 |
| C2 | 1.40028813e-012 |

TABLE 6-continued

ASPHERIC CONSTANTS

| | |
|---|---|
| C3 | -1.04629804e-016 |
| C4 | 9.68145933e-022 |
| C5 | -8.29015519e-026 |
| C6 | -2.79089191e-030 |
| C7 | 0.00000000e+000 |
| C8 | 0.00000000e+000 |
| C9 | 0.00000000e+000 |

SURFACE NO. 31

| | |
|---|---|
| K | 0.0000 |
| C1 | 2.31274915e-009 |
| C2 | 5.27830899e-014 |
| C3 | -2.07768704e-018 |
| C4 | -6.60919096e-023 |
| C5 | 4.30024872e-027 |
| C6 | -5.82559285e-032 |
| C7 | 0.00000000e+000 |
| C8 | 0.00000000e+000 |
| C9 | 0.00000000e+000 |

SURFACE NO. 38

| | |
|---|---|
| K | 0.0000 |
| C1 | 1.22133020e-009 |
| C2 | 9.82170002e-014 |
| C3 | -4.08875155e-018 |
| C4 | 2.25637760e-022 |
| C5 | -5.76550179e-027 |
| C6 | 7.24587177e-032 |
| C7 | 0.00000000e+000 |
| C8 | 0.00000000e+000 |
| C9 | 0.00000000e+000 |

SURFACE NO. 40

| | |
|---|---|
| K | 0.0000 |
| C1 | 2.01766742e-009 |
| C2 | 3.58703800e-013 |
| C3 | 1.38458390e-017 |
| C4 | -1.65456142e-021 |
| C5 | 8.49511243e-026 |
| C6 | -1.87184616e-030 |
| C7 | 0.00000000e+000 |
| C8 | 0.00000000e+000 |
| C9 | 0.00000000e+000 |

SURFACE NO. 42

| | |
|---|---|
| K | 0.0000 |
| C1 | 2.38088222e-008 |
| C2 | 4.23623902e-012 |
| C3 | 3.32178613e-017 |
| C4 | 9.51247573e-021 |
| C5 | -1.75917666e-024 |
| C6 | 2.13969194e-028 |
| C7 | 0.00000000e+000 |
| C8 | 0.00000000e+000 |
| C9 | 0.00000000e+000 |

TABLE 7

| Surface No. | Type | Radius [mm] | Center thickness [mm] | Material | Half diameter [mm] |
|---|---|---|---|---|---|
| | Object plane | | 79.2500 | | |
| 1 | Sphere | -99.4350 | 48.0000 | 'SIO2HL' | 69.6 |
| 2 | Asphere A(1) | -101.0810 | 156.6400 | | 86.1 |
| 3 | Sphere | -723.0640 | 70.0000 | 'SIO2HL' | 120.7 |
| 4 | Asphere A(2) | -183.9000 | 340.9100 | | 126.9 |

TABLE 7-continued

| Surface No. | Type | Radius [mm] | Center thickness [mm] | Material | Half diameter [mm] |
|---|---|---|---|---|---|
|  | Stop |  | 124.2000 |  | 73.5 |
| 5 | Sphere | −180.6640 | 40.0000 | 'CAF2HL' | 93.6 |
| 6 | Asphere A(3) | −141.0650 | 107.0000 |  | 102.1 |
|  | Mirror | ∞ | 138.7300 |  | 150.2 |
| 7 | Asphere A(4) | 172.4900 | 50.0000 | 'SIO2HL' | 136.0 |
| 8 | Sphere | 596.7120 | 47.4580 |  | 133.5 |
| 9 | Sphere | 170.4950 | 56.0000 | 'SIO2HL' | 117.3 |
| 10 | Asphere A(5) | 194.7400 | 30.7260 |  | 107.5 |
| 11 | Sphere | infinity | 7.2500 | 'CAF2HL' | 93.4 |
| 12 | Sphere | 107.4480 | 30.7500 |  | 75.8 |
| 13 | Asphere A(6) | 413.1300 | 24.6400 | 'SIO2HL' | 74.8 |
| 14 | Asphere A(7) | −199.5060 | 1.2500 |  | 72.9 |
| 15 | Sphere | ∞ | 3.0500 | 'CAF2HL' | 70.8 |
| 16 | Sphere | ∞ | 1.2500 |  | 70.3 |
| 17 | Sphere | ∞ | 3.0500 | 'CAF2HL' | 70.0 |
| 18 | Sphere | ∞ | 51.4480 |  | 69.6 |
| 19 | Sphere | ∞ | 6.3000 | 'SIO2HL' | 57.3 |
| 20 | Sphere | ∞ | 0.0000 |  | 56.8 |
|  | Image plane |  | 0.0000 |  | 56.8 |

TABLE 8

| Asphere | Curvature | K | A | B | C | D | E |
|---|---|---|---|---|---|---|---|
| A(1) | −0.00989306 | −1.016679 | −6.011E−08 | −2.104E−12 | −8.452E−17 | −9.101E−21 | 0.000E+00 |
| A(2) | −0.00543774 | 0.172377 | 1.415E−08 | 5.799E−13 | −5.406E−18 | 8.810E−22 | 0.000E+00 |
| A(3) | −0.00708893 | −0.740223 | −1.794E−08 | 1.226E−13 | −3.779E−17 | 1.585E−21 | 0.000E+00 |
| A(4) | 0.00579744 | −0.487512 | −1.532E−08 | 8.915E−14 | −3.181E−19 | −1.307E−22 | 0.000E+00 |
| A(5) | 0.00513505 | −1.224675 | −1.442E−07 | 7.613E−13 | 1.473E−16 | −3.805E−21 | 0.000E+00 |
| A(6) | 0.00242055 | −5.404462 | −1.062E−07 | 8.090E−12 | −3.350E−16 | 7.063E−19 | −1.193E−22 |
| A(7) | −0.00501238 | 1.430927 | 1.452E−07 | 1.114E−11 | 1.352E−15 | 5.307E−19 | −9.312E−23 |

TABLE 9

| | Pupil function: | |
|---|---|---|
| Image field height [mm] | Actual value [mrad] | Actual-desired [mrad] |
| 63.6 | 5.34 | 0.09 |
| 57.3 | 1.59 | −0.10 |
| 51.0 | −0.90 | 0.06 |
| 44.6 | −2.65 | 0.10 |
| 38.3 | −3.76 | −0.01 |
| 31.9 | −4.21 | −0.10 |
| 25.5 | −4.00 | −0.08 |
| 19.1 | −3.29 | 0.01 |
| 12.8 | −2.28 | 0.09 |
| 6.4 | −1.15 | 0.08 |

TABLE 12

| | Pupil function: | |
|---|---|---|
| Image field height [mm] | Actual value [mrad] | Actual-desired [mrad] |
| 63.6 | 5.34 | 0.09 |
| 57.3 | 1.59 | −0.10 |
| 51.0 | −0.92 | 0.04 |
| 44.6 | −2.64 | 0.10 |
| 38.3 | −3.74 | 0.01 |
| 31.9 | −4.19 | −0.09 |
| 25.5 | −4.00 | −0.08 |
| 19.1 | −3.30 | 0.01 |
| 12.8 | −2.28 | 0.09 |
| 6.4 | −1.15 | 0.09 |

TABLE 15

| | Pupil function: | |
|---|---|---|
| Image field height [mm] | Actual value [mrad] | Actual-desired [mrad] |
| 63.6 | 5.32 | 0.07 |
| 57.3 | 1.59 | −0.10 |
| 51.0 | −0.92 | 0.04 |
| 44.6 | −2.64 | 0.10 |
| 38.3 | −3.74 | 0.01 |
| 31.9 | −4.20 | −0.09 |
| 25.5 | −4.00 | −0.08 |
| 19.1 | −3.30 | 0.01 |
| 12.8 | −2.28 | 0.09 |
| 6.4 | −1.15 | 0.09 |

TABLE 10

|   | RADIUS | THICKNESS |  | 248.3 | EPS | 248.8 |
|---|---|---|---|---|---|---|
|   |   |   |   | 1.0 |   | 1.0 |
| 1************ |   | 45.143 |   | 1.0 |   | 1.0 |
| 2 | −31.6971 | 28.136 | SUPRA1 | 1.508366 | −.055 | 1.508088 |
| 3 | −47.9230 | 39.292 |   | 1.0 |   | 1.0 |
| 4 | 428.1252 | 66.494 | SUPRA1 | 1.508366 | −.055 | 1.508088 |
| 5 | −150.7305 | 18.557 |   | 1.0 |   | 1.0 |
| 6 | 195.9789 | 44.285 | SUPRA1 | 1.508366 | −.055 | 1.508088 |
| 7 | 471.9253 | 163.776 |   | 1.0 |   | 1.0 |
| 8 | −601.7158 | 22.837 | SUPRA1 | 1.508366 | −.055 | 1.508088 |
| 9 | −248.8469 | 22.518 |   | 1.0 |   | 1.0 |
|   | STOP | .000 |   |   |   |   |
| 10************ |   | 16.000 |   | 1.0 |   | 1.0 |
| 11************ |   | 50.950 |   | 1.0 |   | 1.0 |
| 12 | 271.7523 | 46.762 | SUPRA1 | 1.508366 | −.055 | 1.508088 |
| 13 | −332.7323 | 16.448 |   | 1.0 |   | 1.0 |
| 14 | 1632.0761 | 13.064 | SUPRA1 | 1.508366 | −.055 | 1.508088 |
| 15 | 125.5812 | 155.737 |   | 1.0 |   | 1.0 |
| 16************ |   | 357.505 |   | 1.0 |   | 1.0 |
| 17 | −406.8452 | 24.422 | SUPRA1 | 1.508366 | −.055 | 1.508088 |
| 18 | −176.1262 | 4.072 |   | 1.0 |   | 1.0 |
| 19************ |   | 4.000 | SUPRA1 | 1.508366 | −.055 | 1.508088 |
| 20************ |   | 60.000 |   | 1.0 |   | 1.0 |
| 21************ |   | .000 |   | 1.0 |   | 1.0 |
| 22************ |   |   |   | 1.0 |   | 1.0 |

TABLE 11

| SURFACE |   | ASPHERIC CONSTANTS | | | | | |
|---|---|---|---|---|---|---|---|
| 5 | A | .30700259 | .36275241E−07 | .14555048E−11 | −.25367843E−16 | .64827842E−21 | .00000000E+00 |
|   |   | .00000000E+00 | .00000000E+00 | .00000000E+00 |   |   |   |
| 9 | A | .01609567 | .44063917E−07 | .16962313E−11 | −.81523571E−17 | .54237049E−20 | .00000000E+00 |
|   |   | .00000000E+00 | .00000000E+00 | .00000000E+00 |   |   |   |
| 17 | A | −.00048398 | .45060462E−07 | .70280547E−11 | .20097185E−14 | .00000000E+00 | .00000000E+00 |
|   |   | .00000000E+00 | .00000000E+00 | .00000000E+00 |   |   |   |
| 18 | A | .00009906 | .48624218E−07 | .27774765E−10 | −.49448573E−14 | .94856328E−18 | −.37136823E−22 |
|   |   | .00000000E+00 | .00000000E+00 | .00000000E+00 |   |   |   |

TABLE 13

|   | RADIUS | THICKNESS |  | 248.3 | EPS | 248.8 |
|---|---|---|---|---|---|---|
|   |   |   |   | 1.0 |   | 1.0 |
| 1************ |   | 68.629 |   | 1.0 |   | 1.0 |
| 2 | −41.3402 | 37.553 | SUPRA1 | 1.508366 | −.055 | 1.508088 |
| 3 | −65.1683 | 1.899 |   | 1.0 |   | 1.0 |
| 4 | −1821.9029 | 52.155 | SUPRA1 | 1.508366 | −.055 | 1.508088 |
| 5 | −165.0414 | 20.937 |   | 1.0 |   | 1.0 |
| 6 | 277.4757 | 67.266 | SUPRA1 | 1.508366 | −.055 | 1.508088 |
| 7 | −381.8306 | 200.731 |   | 1.0 |   | 1.0 |
| 8************ |   | 17.900 |   | 1.0 |   | 1.0 |
|   | STOP | .000 |   |   |   |   |
| 9************ |   | 19.430 |   | 1.0 |   | 1.0 |
| 10 | 169.1379 | 50.513 | SUPRA1 | 1.508366 | −.055 | 1.508088 |
| 11 | −2197.7333 | 72.898 |   | 1.0 |   | 1.0 |
| 12 | 350.2263 | 11.856 | SUPRA1 | 1.508366 | −.055 | 1.508088 |
| 13 | 103.0750 | 128.232 |   | 1.0 |   | 1.0 |
| 14************ |   | 339.584 |   | 1.0 |   | 1.0 |
| 15 | −183.2474 | 21.658 | SUPRA1 | 1.508366 | −.055 | 1.508088 |
| 16 | −114.7171 | 24.758 |   | 1.0 |   | 1.0 |
| 17************ |   | 4.000 | SUPRA1 | 1.508366 | −.055 | 1.508088 |
| 18************ |   | 60.000 |   | 1.0 |   | 1.0 |
| 19************ |   | .000 |   | 1.0 |   | 1.0 |
| 20************ |   |   |   | 1.0 |   | 1.0 |

TABLE 14

| SURFACE | | ASPHERIC CONSTANTS | | | | | |
|---|---|---|---|---|---|---|---|
| 4 | A | .00088826 | .33072665E−08 | −.27728125E−12 | .66528381E−16 | −.27747818E−20 | .00000000E+00 |
| | | | .00000000E+00 | .00000000E+00 | .00000000E+00 | | |
| 7 | A | .00146323 | .23687863E−07 | −.73089141E−13 | .70178044E−17 | −.17741133E−21 | .00000000E+00 |
| | | | .00000000E+00 | .00000000E+00 | .00000000E+00 | | |
| 11 | A | .00013830 | .41436721E−07 | −.16796245E−12 | .59248839E−17 | −.91470033E−22 | .00000000E+00 |
| | | | .00000000E+00 | .00000000E+00 | .00000000E+00 | | |
| 15 | A | −.02425149 | −.95943615E−07 | −.10248697E−11 | .27847883E−14 | .00000000E+00 | .00000000E+00 |
| | | | .00000000E+00 | .00000000E+00 | .00000000E+00 | | |
| 16 | A | −.00011652 | −.37799825E−07 | .24137738E−10 | −.59574191E−14 | .12288559E−17 | −.59577481E−22 |
| | | | .00000000E+00 | .00000000E+00 | .00000000E+00 | | |

TABLE 16

| | RADIUS | THICKNESS | | 248.3 | EPS | 248.8 |
|---|---|---|---|---|---|---|
| | | | | 1.0 | | 1.0 |
| 1************ | | 65.935 | | 1.0 | | 1.0 |
| 2 | −40.6035 | 38.487 | SUPRA1 | 1.508366 | −.055 | 1.508088 |
| 3 | −64.3159 | 5.680 | | 1.0 | | 1.0 |
| 4 | 1995.7246 | 53.136 | SUPRA1 | 1.508366 | −.055 | 1.508088 |
| 5 | −189.7903 | 26.685 | | 1.0 | | 1.0 |
| 6 | 344.0589 | 66.052 | SUPRA1 | 1.508366 | −.055 | 1.508088 |
| 7 | −298.0580 | 198.231 | | 1.0 | | 1.0 |
| 8************ | | 17.900 | | 1.0 | | 1.0 |
| STOP | | .000 | | | | |
| 9************ | | 12.589 | | 1.0 | | 1.0 |
| 10 | 182.3714 | 55.709 | SUPRA1 | 1.508366 | −.055 | 1.508088 |
| 11 | −512.3841 | 47.471 | | 1.0 | | 1.0 |
| 12 | 700.0127 | 12.241 | SUPRA1 | 1.508366 | −.055 | 1.508088 |
| 13 | 104.1003 | 149.883 | | 1.0 | | 1.0 |
| 14************ | 343.316 | | | 1.0 | | 1.0 |
| 15 | −184.4560 | 20.375 | SUPRA1 | 1.508366 | −.055 | 1.508088 |
| 16 | −115.3836 | 22.308 | | 1.0 | | 1.0 |
| 17************ | | 4.000 | SUPRA1 | 1.508366 | −.055 | 1.508088 |
| 18************ | | 60.000 | | 1.0 | | 1.0 |
| 19************ | | .000 | | 1.0 | | 1.0 |
| 20************ | | | | 1.0 | | 1.0 |

TABLE 17

| SURFACE | | ASPHERIC CONSTANTS | | | | | |
|---|---|---|---|---|---|---|---|
| 7 | A | .00534764 | .28361731E−07 | −.33416725E−13 | −.27596098E−17 | .53973409E−22 | .00000000E+00 |
| | | | .00000000E+00 | .00000000E+00 | .00000000E+00 | | |
| 11 | A | −.00014610 | .39915901E−07 | −.39110773E−12 | .38577737E−17 | −.77184166E−22 | .00000000E+00 |
| | | | .00000000E+00 | .00000000E+00 | .00000000E+00 | | |
| 15 | A | −.03140665 | .10763439E−06 | .40961531E−11 | .26507084E−14 | .00000000E+00 | .00000000E+00 |
| | | | .00000000E+00 | .00000000E+00 | .00000000E+00 | | |
| 16 | A | −.00031061 | .48775194E−07 | .21584376E−10 | .59528473E−14 | .12049627E−17 | −.59417852E−22 |
| | | | .00000000E+00 | .00000000E+00 | .00000000E+00 | | |

TABLE 18 j124o

| Sur. No. | Radius | Thickness/Distance | Material | Refr. Index | Fr. Diam. |
|---|---|---|---|---|---|
| 0 | 0 | 40 | | 1 | 136 |
| 1 | 0 | 0 | | 1 | 162.238 |
| 2 | 0 | 10 | SIO2HL | 1.56018811 | 162.238 |
| 3 | 0 | 90.00242783 | | 1 | 166.316 |
| 4 | 0 | 126.1714501 | | 1 | 225.352 |
| 5 | 284.819283 | 88.25879422 | SIO2HL | 1.56018811 | 346.704 |
| 6 | −718.846875 | 67.94464464 | | 1 | 344.764 |
| 7 | 332.99532 | 29.58650607 | SIO2HL | 1.56018811 | 277.8 |
| 8 | 229.906571 | 87.36888257 | | 1 | 252.304 |
| 9 | −221.626736 | 15 | SIO2HL | 1.56018811 | 247.846 |
| 10 | −858.351043 | 96.28958137 | | 1 | 258.722 |

TABLE 18-continued j124o

| Sur. No. | Radius | Thickness/Distance | Material | Refr. Index | Fr. Diam. | |
|---|---|---|---|---|---|---|
| 11 | −223.041108 | 15 | SIO2HL | 1.56018811 | 272.15 | |
| 12 | −610.039132 | 43.05996383 | | 1 | 300.996 | |
| 13 | −221.235303 | 15 | SIO2HL | 1.56018811 | 303.626 | |
| 14 | −496.460616 | 39.93674981 | | 1 | 353.65 | |
| 15 | 0 | 0 | | −1 | 488.926 | REFL |
| 16 | 261.673247 | 39.93674981 | | 1 | 358.9 | REFL |
| 17 | 496.460616 | 15 | SIO2HL | 1.56018811 | 352.086 | |
| 18 | 221.235303 | 43.05996383 | | 1 | 294.964 | |
| 19 | 610.039132 | 15 | SIO2HL | 1.56018811 | 288.496 | |
| 20 | 223.041108 | 96.28958137 | | 1 | 256.802 | |
| 21 | 858.351043 | 15 | SIO2HL | 1.56018811 | 225.826 | |
| 22 | 221.626736 | 87.36888257 | | 1 | 211.74 | |
| 23 | −229.906571 | 29.58650607 | SIO2HL | 1.56018811 | 209.998 | |
| 24 | −332.99532 | 67.94464464 | | 1 | 221.786 | |
| 25 | 718.846875 | 88.25879422 | SIO2HL | 1.56018811 | 233.566 | |
| 26 | −284.819283 | 148.919977 | | 1 | 231.788 | |
| 27 | 0 | 117.2478983 | | 1 | 163.64 | |
| 28 | 0 | 24.99733735 | | 1 | 242.922 | |
| 29 | 603.370765 | 39.04445671 | SIO2HL | 1.56018811 | 270.182 | |
| 30 | −636.597636 | 0.948767519 | | 1 | 272.294 | |
| 31 | 342.176859 | 50.00126936 | SIO2HL | 1.56018811 | 277.832 | |
| 32 | 17319.8551 | 73.84714255 | | 1 | 272.836 | |
| 33 | −218.591907 | 8.99910435 | SIO2HL | 1.56018811 | 262.016 | |
| 34 | 904.679885 | 54.19491053 | | 1 | 281.338 | |
| 35 | −680.586753 | 54.40626463 | SIO2HL | 1.56018811 | 299.432 | |
| 36 | −220.41366 | 5.817238376 | | 1 | 305.088 | |
| 37 | 500.62792 | 15.60974916 | SIO2HL | 1.56018811 | 297.022 | |
| 38 | 198.761197 | 53.16103132 | | 1 | 282.566 | |
| 39 | 814.404669 | 36.98819327 | SIO2HL | 1.56018811 | 289.582 | |
| 40 | −871.120646 | 0.949164971 | | 1 | 294.484 | |
| 41 | 835.76703 | 39.91455494 | SIO2HL | 1.56018811 | 307.664 | |
| 42 | −726.054716 | 0.949236893 | | 1 | 309.074 | |
| 43 | 317.363233 | 57.34718751 | SIO2HL | 1.56018811 | 309.176 | |
| 44 | 3960.12424 | 39.5720585 | | 1 | 301.446 | |
| 45 | −420.71174 | 9.499467238 | SIO2HL | 1.56018811 | 297.386 | |
| 46 | 359.94645 | 56.65260716 | | 1 | 296.478 | |
| 47 | −2691.51008 | 44.96770761 | SIO2HL | 1.56018811 | 306.182 | |
| 48 | −306.711407 | 3.572848114 | | 1 | 310.034 | |
| 49 | 742.794849 | 27.51408106 | SIO2HL | 1.56018811 | 310.324 | |
| 50 | −5522.84952 | −0.960213691 | | 1 | 309.836 | |
| 51 | 0 | 1.905954202 | | 1 | 308.384 | |
| 52 | 286.444693 | 47.52996513 | SIO2HL | 1.56018811 | 309.936 | |
| 53 | 2180.55421 | 0.940628914 | | 1 | 306.14 | |
| 54 | 223.755941 | 47.20113369 | SIO2HL | 1.56018811 | 282.118 | |
| 55 | 764.2653 | 0.937188691 | | 1 | 273.64 | |
| 56 | 142.961746 | 51.14510511 | SIO2HL | 1.56018811 | 221.778 | |
| 57 | 594.670868 | 0.91280099 | | 1 | 207.25 | |
| 58 | 120.817932 | 25.60552721 | SIO2HL | 1.56018811 | 154.022 | |
| 59 | 234.539697 | 0.813496277 | | 1 | 132.74 | |
| 60 | 117.536405 | 41.01820363 | SIO2HL | 1.56018811 | 112.148 | |
| 61 | 0 | 2.00024195 | H2OV193 | 1.43667693 | 40.986 | |
| 62 | 0 | −0.00024161 | | 1 | 34.006 | |

TABLE 19

| Aspheres Sur. No. | K | C1 | C2 | C3 | C4 | C5 | C6 |
|---|---|---|---|---|---|---|---|
| 6 | 0 | 1.81054E−09 | −2.31090E−14 | 9.96078E−19 | −1.12802E−23 | 7.07088E−29 | −6.95390E−34 |
| 12 | 0 | −8.90600E−10 | −1.51217E−13 | 4.88272E−21 | 8.25531E−23 | −2.79550E−27 | 2.35098E−31 |
| 14 | 0 | −3.34713E−09 | 5.94735E−14 | −1.82452E−19 | −1.16648E−23 | 7.22990E−28 | −2.74308E−32 |
| 17 | 0 | 3.34713E−09 | −5.94735E−14 | 1.82452E−19 | 1.16648E−23 | −7.22990E−28 | 2.74308E−32 |
| 19 | 0 | 8.90600E−10 | 1.51217E−13 | −4.88272E−21 | −8.25531E−23 | 2.79550E−27 | −2.35098E−31 |
| 25 | 0 | −1.81054E−09 | 2.31090E−14 | −9.96078E−19 | 1.12802E−23 | −7.07088E−29 | 6.95390E−34 |
| 34 | 0 | −2.09777E−09 | −5.69167E−14 | −2.08879E−19 | 3.29541E−23 | 6.66605E−28 | −1.96222E−32 |
| 45 | 0 | −7.23645E−09 | 1.09023E−13 | −3.10776E−18 | 3.84103E−22 | −9.66600E−27 | −8.74269E−32 |
| 47 | 0 | −7.61174E−09 | 2.65544E−13 | −7.37805E−18 | 3.19143E−22 | −2.12393E−26 | 5.21669E−31 |
| 53 | 0 | 4.28502E−10 | 4.33345E−13 | −2.08439E−17 | 2.18135E−22 | 5.73143E−27 | −1.02762E−31 |
| 57 | 0 | 8.39683E−09 | 8.08208E−13 | −6.65945E−17 | 5.13258E−21 | −3.16949E−25 | 8.16626E−30 |
| 59 | 0 | 4.78541E−08 | 6.68577E−12 | −1.88747E−16 | −1.54458E−20 | 1.63093E−23 | −1.04350E−27 |

TABLE 20 j127o

| Sur. No. | Radius | Thickness/distance | Material | Refr. Index | Fr. Diam. | |
|---|---|---|---|---|---|---|
| 0 | 0 | 40 | | 1 | 136 | |
| 1 | 0 | 0 | | 1 | 162.23 | |
| 2 | 0 | 10 | SIO2HL | 1.56018811 | 162.23 | |
| 3 | 0 | 90.00136568 | | 1 | 166.306 | |
| 4 | 0 | 126.9754212 | | 1 | 225.326 | |
| 5 | 287.871657 | 87.61804518 | SIO2HL | 1.56018811 | 346.638 | |
| 6 | −714.813191 | 72.13214669 | | 1 | 344.79 | |
| 7 | 332.204484 | 30.00699117 | SIO2HL | 1.56018811 | 277.208 | |
| 8 | 228.934009 | 86.52185874 | | 1 | 251.744 | |
| 9 | −225.793329 | 15 | SIO2HL | 1.56018811 | 247.436 | |
| 10 | −736.477377 | 88.69950684 | | 1 | 257.478 | |
| 11 | −223.422523 | 15 | SIO2HL | 1.56018811 | 267.924 | |
| 12 | −670.949887 | 43.07304995 | | 1 | 295.618 | |
| 13 | −220.819788 | 15 | SIO2HL | 1.56018811 | 298.228 | |
| 14 | −499.016297 | 39.4948838 | | 1 | 345.992 | |
| 15 | 0 | 0 | | −1 | 474.852 | REFL |
| 16 | 259.210693 | 39.4948838 | | 1 | 351.666 | REFL |
| 17 | 499.016297 | 15 | SIO2HL | 1.56018811 | 344.228 | |
| 18 | 220.819788 | 43.07304995 | | 1 | 289.47 | |
| 19 | 670.949887 | 15 | SIO2HL | 1.56018811 | 283.008 | |
| 20 | 223.422523 | 88.69950684 | | 1 | 252.278 | |
| 21 | 736.477377 | 15 | SIO2HL | 1.56018811 | 225.524 | |
| 22 | 225.793329 | 86.52185874 | | 1 | 212.25 | |
| 23 | −228.934009 | 30.00699117 | SIO2HL | 1.56018811 | 210.37 | |
| 24 | −332.204484 | 72.13214669 | | 1 | 222.306 | |
| 25 | 714.813191 | 87.61804518 | SIO2HL | 1.56018811 | 234.366 | |
| 26 | −287.871657 | 150.4821633 | | 1 | 232.45 | |
| 27 | 0 | 116.4962314 | | 1 | 163.22 | |
| 28 | 0 | 24.99582853 | | 1 | 242.07 | |
| 29 | 608.165543 | 38.78395838 | SIO2HL | 1.56018811 | 269.198 | |
| 30 | −633.325408 | 0.947612575 | | 1 | 271.334 | |
| 31 | 344.637109 | 45.34004131 | SIO2HL | 1.56018811 | 276.98 | |
| 32 | −62952.622 | 76.39801942 | | 1 | 273.248 | |
| 33 | −217.488195 | 8.998996112 | SIO2HL | 1.56018811 | 261.15 | |
| 34 | 996.855971 | 54.49706951 | | 1 | 280.182 | |
| 35 | −688.700451 | 54.41929128 | SIO2HL | 1.56018811 | 298.924 | |
| 36 | −219.471564 | 1.418978688 | | 1 | 304.346 | |
| 37 | 431.058008 | 15.20870568 | SIO2HL | 1.56018811 | 294.528 | |
| 38 | 192.067389 | 63.01795094 | | 1 | 278.474 | |
| 39 | 987.105089 | 32.04274664 | SIO2HL | 1.56018811 | 290.984 | |
| 40 | −891.544249 | 0.948742302 | | 1 | 294.704 | |
| 41 | 677.684124 | 41.63748934 | SIO2HL | 1.56018811 | 308.902 | |
| 42 | −818.475719 | 0.949203181 | | 1 | 309.902 | |
| 43 | 325.99568 | 57.4047341 | SIO2HL | 1.56018811 | 307.608 | |
| 44 | 13052.304 | 36.34195774 | | 1 | 299.756 | |
| 45 | −390.220688 | 9.497543304 | SIO2HL | 1.56018811 | 297.718 | |
| 46 | 350.704764 | 54.90641556 | | 1 | 297.02 | |
| 47 | −2978.76559 | 46.68826821 | SIO2HL | 1.56018811 | 306.046 | |
| 48 | −300.028769 | 0.944451222 | | 1 | 310.008 | |
| 49 | 871.548118 | 27.20190252 | SIO2HL | 1.56018811 | 310.024 | |
| 50 | −2770.02197 | −1.193616306 | | 1 | 309.682 | |
| 51 | 0 | 2.132719511 | | 1 | 308.032 | |
| 52 | 271.299915 | 46.98951537 | SIO2HL | 1.56018811 | 309.962 | |
| 53 | 1226.61461 | 0.930593484 | | 1 | 305.892 | |
| 54 | 234.802856 | 49.00464753 | SIO2HL | 1.56018811 | 284.866 | |
| 55 | 1226.61461 | 0.922464986 | | 1 | 276.644 | |
| 56 | 137.676807 | 51.75763941 | SIO2HL | 1.56018811 | 217.64 | |
| 57 | 542.765286 | 0.899139131 | | 1 | 202.58 | |
| 58 | 118.289771 | 24.20432254 | SIO2HL | 1.56018811 | 149.71 | |
| 59 | 209.420984 | 0.848851855 | | 1 | 127.784 | |
| 60 | 116.984714 | 40.14644803 | SIO2HL | 1.56018811 | 110.648 | |
| 61 | 0 | 2.000071048 | H2OV193 | 1.43667693 | 40.976 | |
| 62 | 0 | −0.00007074 | | 1 | 34.002 | |

TABLE 21

| Aspheres Sur. No. | K | C1 | C2 | C3 | C4 | C5 | C6 |
|---|---|---|---|---|---|---|---|
| 6 | 0 | 1.69174E−09 | −2.05881E−14 | 1.03251E−18 | −1.12193E−23 | 3.90449E−29 | −5.29045E−34 |
| 12 | 0 | −1.41589E−09 | −1.57552E−13 | 1.25094E−18 | 2.21664E−23 | 2.23065E−28 | 1.88935E−31 |
| 14 | 0 | −3.46732E−09 | 6.26464E−14 | −3.07498E−19 | −8.03587E−24 | 6.53890E−28 | −3.03891E−32 |

TABLE 21-continued

| Aspheres Sur. No. | K | C1 | C2 | C3 | C4 | C5 | C6 |
|---|---|---|---|---|---|---|---|
| 17 | 0 | 3.46732E−09 | −6.26464E−14 | 3.07498E−19 | 8.03587E−24 | −6.53890E−28 | 3.03891E−32 |
| 19 | 0 | 1.41589E−09 | 1.57552E−13 | −1.25094E−18 | −2.21664E−23 | −2.23065E−28 | −1.88935E−31 |
| 25 | 0 | −1.69174E−09 | 2.05881E−14 | −1.03251E−18 | 1.12193E−23 | −3.90449E−29 | 5.29045E−34 |
| 34 | 0 | −2.08973E−09 | −3.21415E−14 | −4.89621E−19 | 4.99266E−23 | 6.37920E−29 | −1.16558E−32 |
| 45 | 0 | −9.02991E−09 | 1.92955E−13 | −2.66461E−18 | 2.63723E−22 | −8.86762E−27 | −3.54012E−32 |
| 47 | 0 | −6.06114E−09 | 1.64132E−13 | −4.22802E−18 | 1.75836E−22 | −1.41128E−26 | 4.02240E−31 |
| 53 | 0 | 1.24264E−09 | 2.65702E−13 | −1.73022E−17 | 2.87349E−22 | 2.96301E−27 | −8.89915E−32 |
| 55 | 0 | 1.24264E−09 | 2.65702E−13 | −1.73022E−17 | 2.87349E−22 | 2.96301E−27 | −8.89915E−32 |
| 57 | 0 | −2.48214E−09 | 1.65060E−12 | −4.57406E−17 | 4.60607E−22 | −6.08631E−26 | 2.96024E−30 |
| 59 | 0 | 6.48548E−08 | 5.64309E−12 | −3.20630E−17 | −3.28553E−20 | 2.51656E−23 | −1.95410E−27 |

The invention claimed is:

1. An illumination system for a microlithography projection exposure system, the illumination system comprising:
an optical imaging system for imaging an object field arranged in an object plane of the imaging system into an image field arranged in an image plane of the imaging system, wherein:
the optical imaging system includes a plurality of lenses that are arranged between the object plane and the image plane, wherein each of the lenses has a first lens surface and a second lens surface, and
at least one of the lenses is a double aspheric lens in which each of the first lens surface and the second lens surface is an aspheric surface.

2. The illumination system as claimed in claim 1, wherein the first lens surface and the second lens surface of the double aspheric lens are shaped to be substantially symmetrical relative to one another.

3. The illumination system as claimed in claim 1, wherein the first lens surface and the second lens surface of the double aspheric lens have substantially the same surface description with reference to curvature and aspheric constants.

4. The illumination system as claimed in claim 1, wherein the first lens surface and the second lens surface of the double aspheric lens are shaped such that they can substantially be transformed into one another by means of an orthotomic projection.

5. The illumination system as claimed in claim 1, wherein the first lens surfaces and the second lens surface of the double aspheric lens are shaped such that they can be tested with the same test optics.

6. The illumination system as claimed in claim 1, wherein the double aspheric lens is arranged in the vicinity of a field plane of the imaging system such that the principal ray height is greater than the marginal ray height of the imaging system at the double aspheric lens.

7. The illumination system as claimed in claim 1, wherein the imaging system is an objective for imaging an illumination field, arranged in an intermediate field plane of the illumination system, into an exit plane of the illumination system.

8. The illumination system according to claim 7, wherein the imaging system has a linear magnification between approximately 1:1 and 1:5.

9. The illumination system as claimed in claim 1, wherein the double aspheric lens is the last lens of the imaging system, closest to the image plane.

10. The illumination system as claimed in claim 1, wherein the double aspheric lens is a substantially symmetrical biconvex lens.

11. The illumination system as claimed in claim 1, wherein the double aspheric lens is shaped as a meniscus lens.

12. The illumination system as claimed in claim 11, wherein the meniscus lens has an image-side convex surface.

13. An optical imaging system for a microlithography projection exposure system for imaging an object field arranged in an object plane of the imaging system into an image field arranged in an image plane of the imaging system, the imaging system comprising:
a plurality of lenses that are arranged between the object plane and the image plane, wherein:
the plurality of lenses comprise a first aspheric lens surface and at least one second aspheric lens surface, and
the first aspheric lens surface and the second aspheric lens surface have substantially the same surface description with reference to curvature and aspheric constant.

14. The optical imaging system as claimed in claim 13, wherein the first aspheric lens surface and the second aspheric lens surface are formed on the same lens, whereby a double aspheric lens is formed.

15. The optical imaging system as claimed in claim 13, wherein the first aspheric lens surface and the second aspheric lens surface are formed on different lenses.

16. The optical imaging system as claimed in claim 15, wherein at least one other optical surface is arranged between the first aspheric lens surface and the second aspheric lens surface.

17. The optical imaging system as claimed in claim 13, wherein the imaging system is a projection objective for imaging a pattern of a mask arranged in an object plane of the projection objective into the image plane of the projection objective.

18. The optical imaging system according to claim 13, wherein the imaging system is a subsystem integrated in an illumination system of a microlithography exposure apparatus.

19. An optical imaging system for a microlithography projection exposure system for imaging an object field arranged in an object plane of the imaging system into an image field arranged in an image plane of the imaging system, the imaging system comprising:
a plurality of lenses that are arranged between the object plane and the image plane, wherein:
the plurality of lenses comprise a first aspheric lens surface and at least one second aspheric lens surface, and
the first aspheric lens surface and the aspheric second lens surface are shaped such that they can substantially be transformed into one another by means of an orthotomic projection.

20. The optical imaging system as claimed in claim 19, wherein the first aspheric lens surface and the second aspheric lens surface are formed on the same lens, whereby a double aspheric lens is formed.

21. The optical imaging system as claimed in claim 19, wherein the first aspheric lens surface and the second aspheric lens surface are formed on different lenses.

22. The optical imaging system as claimed in claim 21, wherein at least one other optical surface is arranged between the first aspheric lens surface and the second aspheric lens surface.

23. The optical imaging system as claimed in claim 19, wherein the imaging system is a projection objective for imaging a pattern of a mask arranged in an object plane of the projection objective into the image plane of the projection objective.

24. The optical imaging system according to claim 19, wherein the imaging system is a subsystem integrated in an illumination system of a microlithography exposure apparatus.

* * * * *